US010636790B2

(12) United States Patent
Oh et al.

(10) Patent No.: US 10,636,790 B2
(45) Date of Patent: Apr. 28, 2020

(54) SEMICONDUCTOR DEVICES AND METHODS FOR MANUFACTURING THE SAME

(71) Applicant: Samsung Electronics Co., Ltd., Suwon-si, Gyeonggi-do (KR)

(72) Inventors: Min-chul Oh, Seoul (KR); Sejin Park, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 16/141,923

(22) Filed: Sep. 25, 2018

(65) Prior Publication Data

US 2019/0027474 A1     Jan. 24, 2019

Related U.S. Application Data

(63) Continuation of application No. 15/478,234, filed on Apr. 3, 2017, now Pat. No. 10,115,722.

(30) Foreign Application Priority Data

May 17, 2016    (KR) ........................ 10-2016-0060334

(51) Int. Cl.
     *H01L 27/092*      (2006.01)
     *H01L 21/8234*     (2006.01)
     (Continued)

(52) U.S. Cl.
     CPC .... *H01L 27/092* (2013.01); *H01L 21/823481* (2013.01); *H01L 21/823821* (2013.01); *H01L 27/088* (2013.01); *H01L 27/0924* (2013.01); *H01L 29/66674* (2013.01); *H01L 29/66795* (2013.01); *H01L 29/7801* (2013.01); *H01L 29/785* (2013.01); *H01L 21/823431* (2013.01);
     (Continued)

(58) Field of Classification Search
     CPC ............. H01L 27/092; H01L 29/66795; H01L 29/785
     USPC ...................................................... 257/338
     See application file for complete search history.

(56) References Cited

U.S. PATENT DOCUMENTS 8,775,982 B2    7/2014   Lin et al.
9,171,752 B1   10/2015   Wu et al.
(Continued)

FOREIGN PATENT DOCUMENTS

KR      20150118878 A    10/2015
KR      20170041004 A     4/2017

*Primary Examiner* — Fazli Erdem
(74) *Attorney, Agent, or Firm* — Renaissance IP Law Group LLP

(57) ABSTRACT

A semiconductor device and a method for manufacturing the same are disclosed. The method comprises forming active patterns on a substrate that includes first and second logic cell regions adjacent to each other in a first direction, and forming on the substrate a device isolation layer exposing upper portions of the active patterns. The forming the active patterns comprises forming first line mask patterns extending parallel to each other in the first direction and running across the first and second logic cell regions, forming on the first line mask patterns an upper separation mask pattern including a first opening overlapping at least two of the first line mask patterns, forming first hardmask patterns from the at least two first line mask patterns, and etching the substrate to form trenches defining the active patterns.

12 Claims, 39 Drawing Sheets

(51) Int. Cl.
  *H01L 27/088* (2006.01)
  *H01L 21/8238* (2006.01)
  *H01L 29/66* (2006.01)
  *H01L 29/78* (2006.01)

(52) U.S. Cl.
  CPC .. *H01L 21/823878* (2013.01); *H01L 27/0886* (2013.01)

(56) References Cited

U.S. PATENT DOCUMENTS

| | | |
|---|---|---|
| 9,209,179 B2 | 12/2015 | Lee et al. |
| 2013/0285194 A1 | 10/2013 | Lin et al. |
| 2014/0353763 A1 | 12/2014 | Chung et al. |
| 2014/0353769 A1 | 12/2014 | Maeda et al. |
| 2015/0115373 A1 | 4/2015 | Yu et al. |
| 2015/0279995 A1 | 10/2015 | Maeda et al. |
| 2015/0294969 A1 | 10/2015 | Lee et al. |
| 2016/0056081 A1* | 2/2016 | Baek .................. H01L 29/7851 438/283 |
| 2016/0110489 A1 | 4/2016 | Schroeder et al. |
| 2016/0254180 A1 | 9/2016 | Liu et al. |
| 2016/0336183 A1 | 11/2016 | Yuan et al. |
| 2017/0062403 A1 | 3/2017 | Song et al. |
| 2017/0062475 A1 | 3/2017 | Song et al. |
| 2017/0133379 A1* | 5/2017 | Kim .................. H01L 27/0924 |
| 2017/0141211 A1 | 5/2017 | Xie et al. |
| 2017/0200651 A1 | 7/2017 | Lee et al. |
| 2017/0287933 A1 | 10/2017 | Chen et al. |

\* cited by examiner

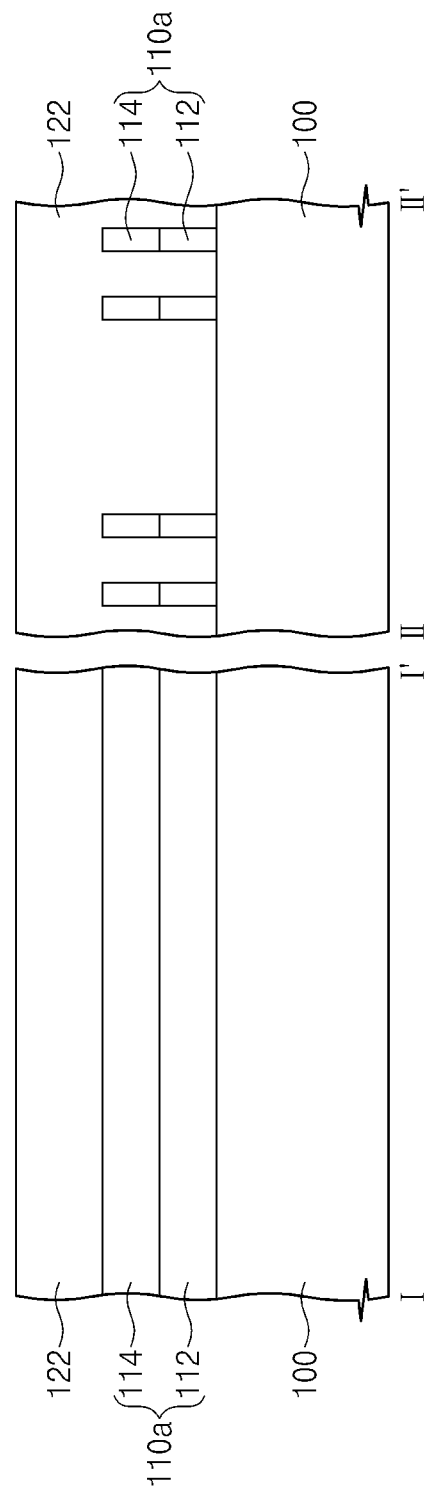

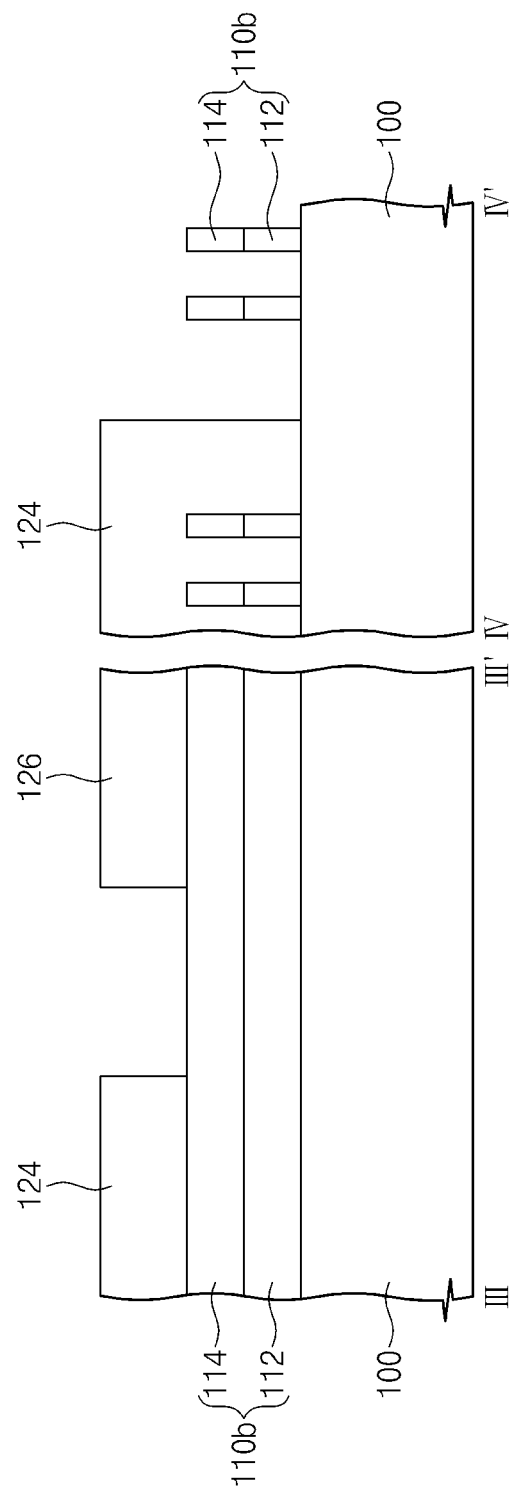

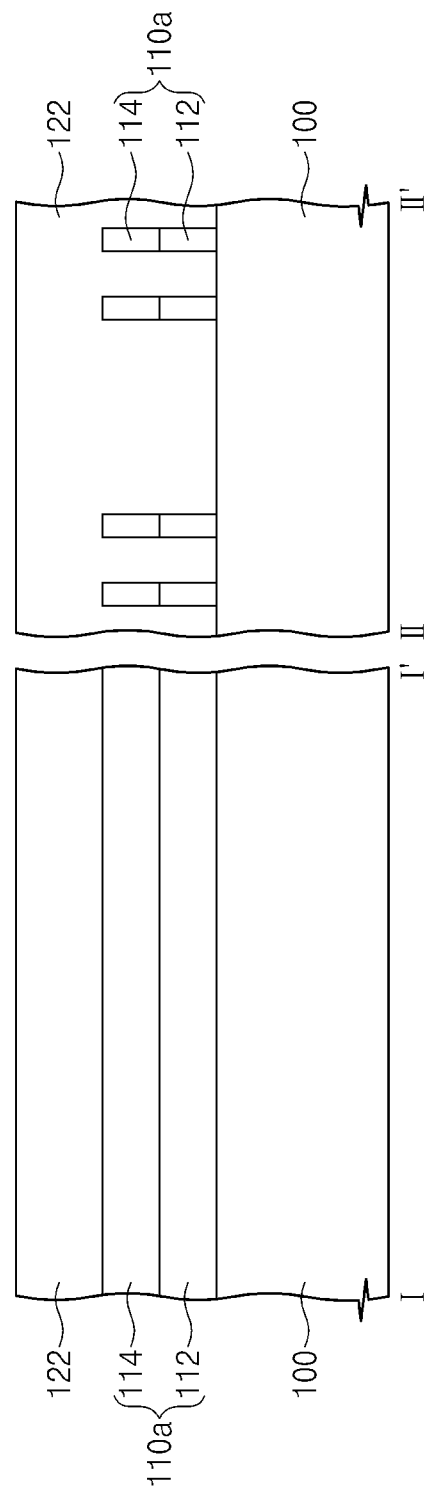

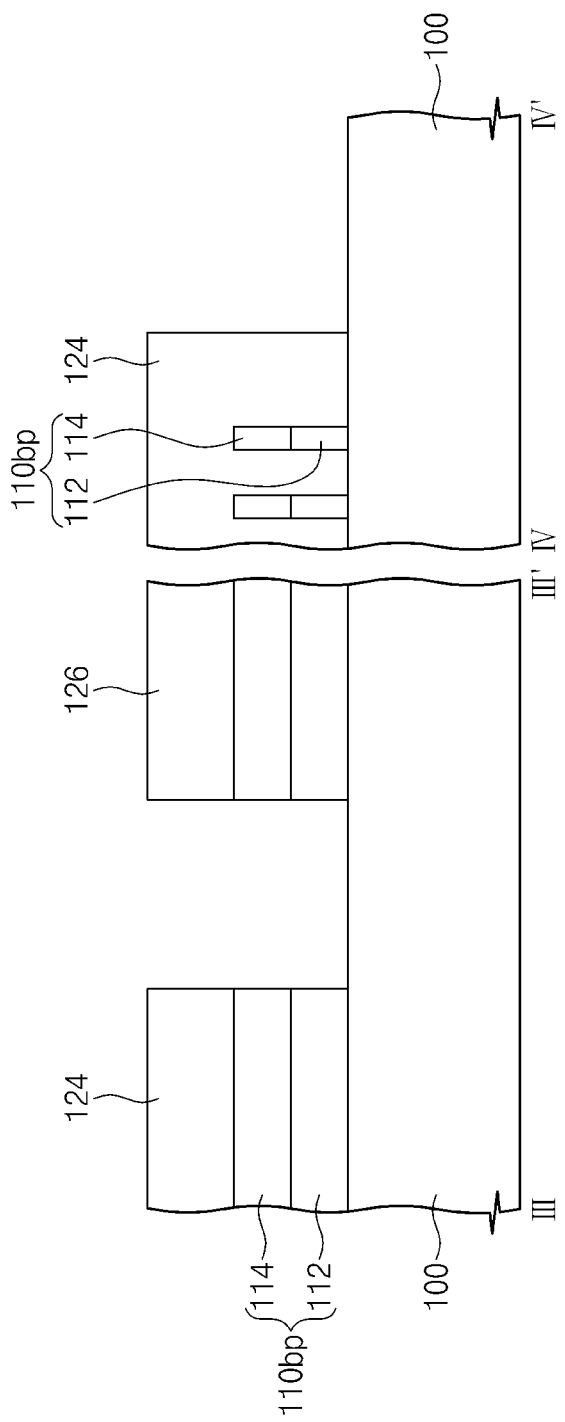

SEMICONDUCTOR DEVICES AND METHODS FOR MANUFACTURING THE SAME

CROSS-REFERENCE TO RELATED APPLICATIONS

This application is a continuation of U.S. patent application Ser. No. 15/478,234, filed on Apr. 3, 2017, which claims the benefit of Korean Patent Application 10-2016-0060334 filed on May 17, 2016, the entire contents of which is hereby incorporated by reference.

BACKGROUND

Embodiments discussed herein relate generally to a semiconductor device and a method of manufacturing the same, and more particularly, to a semiconductor device including a fin field effect transistor and a method of manufacturing the same.

A semiconductor device includes an integrated circuit that consists of MOS (Metal Oxide Semiconductor) FETs. As the size and design rule of semiconductor devices decreases, MOSFETs of the integrated circuit are also decreases. As a MOSFET gets smaller, a short channel effect in the MOSFET may be created, and the operating characteristics of the semiconductor device may thus deteriorate.

SUMMARY

Embodiments of the present inventive concept provide a semiconductor device and a method for manufacturing the same having improved reliability.

According to some exemplary embodiments of the present inventive concept, a method for manufacturing a semiconductor device may comprise: forming active patterns on a substrate that includes first and second logic cell regions adjacent to each other along a first direction; and forming on the substrate a device isolation layer exposing upper portions of the active patterns. The step of forming the active patterns may comprise: forming first line mask patterns extending parallel to each other along the first direction and running across the first and second logic cell regions; forming an upper separation mask pattern on the first line mask patterns, wherein the upper separation mask pattern is positioned on a first cell boundary between the first and second logic cell regions and includes a first opening overlapping at least two of the first line mask patterns; performing a first etch process using the upper separation mask pattern as an etch mask to form first hardmask patterns from the at least two first line mask patterns; and etching an upper portion of the substrate by a second etch process using the first hardmask patterns as an etch mask to form trenches defining the active patterns.

According to some exemplary embodiments of the present inventive concept, a semiconductor device may comprise: a substrate including a plurality of logic cells disposed along a first direction; active patterns; and a device isolation layer on the substrate. The device isolation layer may include a first double diffusion break region that has a first width, as measured along the first direction, and is disposed between a pair of adjacent logic cells and a second double diffusion break region that has a second width, as measured along the first direction, greater than the first width and is disposed between another pair of adjacent logic cells. The active patterns may comprise: a plurality of pairs of first active patterns spaced apart from each other along the first direction with the first double diffusion break region interposed there between; and a plurality of pairs of second active patterns spaced apart from each other along the first direction with the first double diffusion break region interposed there between. The first active patterns may comprise first end portions that are adjacent to a side of the first double diffusion break region and are aligned other along a second direction crossing the first direction. The second active patterns may comprise second end portions that are adjacent to a side of the second double diffusion break region, and one of the second end portions may be offset from another of the second end portions along the first direction.

According to some exemplary embodiments, a semiconductor device may comprise: a substrate including first and second cell regions adjacent to each other along a first direction with a first cell boundary interposed there between and extending along a second direction crossing the first direction; first active patterns arranged on the first and second cell regions along the second direction, each of the first active patterns extending along the first direction but not crossing the first cell boundary; a device isolation layer on the substrate and exposing upper portions of the active patterns. The device isolation layer may include: a first double diffusion break region disposed on the first cell boundary and between at least two pairs of first active patterns that are on different cell regions and adjacent to one another along the first direction; and a first single diffusion break region disposed on at least one selected from the group consisting of the first cell region and the second cell region and between at least two pairs of first active patterns that are on the same cell region and adjacent to one another along the first direction. The semiconductor device may also include gate patterns crossing the first active patterns.

According to some exemplary embodiments, a semiconductor device may comprise: a substrate including first and second cell regions adjacent to each other along a first direction with a cell boundary interposed between the first and second cell regions and extending along a second direction crossing the first direction; active patterns arranged on the first and second cell regions along the second direction, each of the active patterns extending along the first direction but not crossing the first cell boundary; a device isolation layer on the substrate, and exposing portions of the active patterns, wherein the exposed portions of the active patterns include active fins and wherein the device isolation layer includes a double diffusion break region disposed on the cell boundary and between at least two pairs of first active patterns that are on the first and second cell regions and are adjacent to one another along the first direction; gate patterns arranged along the first direction and crossing the active fins along the second direction; and first source/drain regions arranged in upper portions of the active patterns between adjacent ones of the gate patterns, wherein at least one of the first source/drain regions comprises an epitaxial layer and has a top surface that is parallel to a top surface of at least one of the active patterns.

BRIEF DESCRIPTION OF THE DRAWINGS

FIGS. 5A to 15A are plan views illustrating a method for manufacturing a semiconductor device including active patterns according to some exemplary embodiments of the present inventive concept.

FIGS. 5B to 15B are cross-sectional views taken along line I-I' of FIGS. 5A to 15B, respectively.

FIGS. 5C to 15C are cross-sectional views taken along line II-IP of FIGS. 5A to 15A, respectively.

DETAILED DESCRIPTION OF EMBODIMENTS

Figure 1:
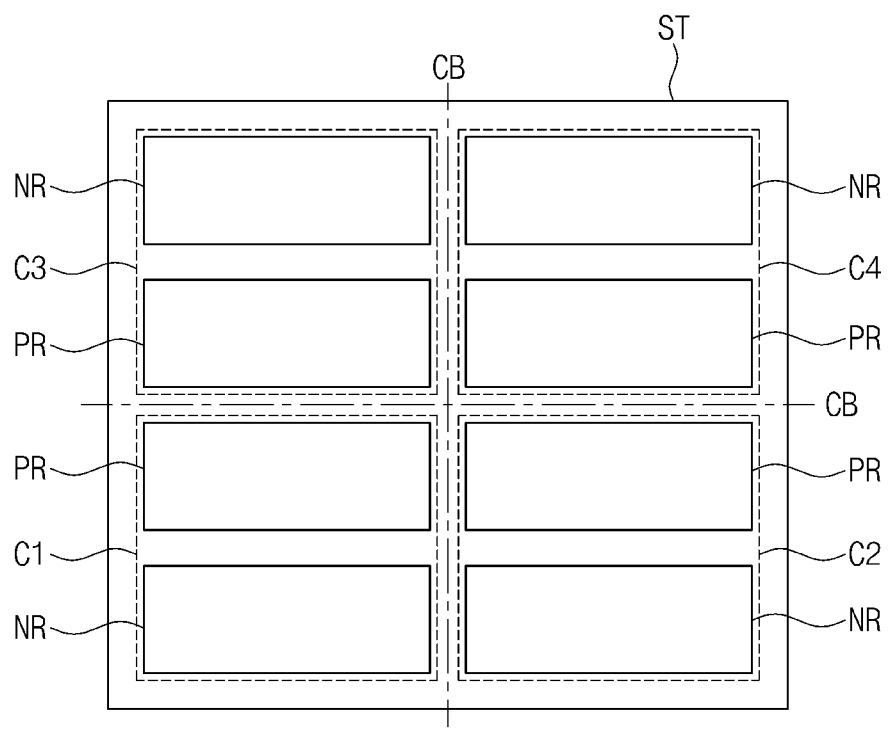
FIG. 1 is a plan view illustrating a semiconductor device according to some exemplary embodiments of the present inventive concept.
Figure 1:
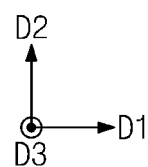

FIG. 1 is a plan view illustrating a semiconductor device according to some exemplary embodiments of the present inventive concept.

Referring to FIG. 1, a plurality of logic cells C1, C2, C3 and C4 may be provided on a substrate of a semiconductor device according to exemplary embodiments of the present inventive concept. Each of the logic cells C1, C2, C3 and C4 may include a plurality of transistors (not shown). For example, the logic cells C1, C2, C3 and C4 may include a first logic cell C1, a second logic cell C2 spaced apart from the first logic cell C1 in a first direction D1, a third logic cell C3 spaced apart from the first logic cell C2 in a second direction D2 that crosses (e.g., is perpendicular to) the first direction D1, and a fourth logic cell C4 spaced apart from the second logic cell C2 in the second direction D2. The fourth logic cell C4 may be spaced apart from the third logic cell C3 in the first direction D1. A cell boundary CB may be defined between adjacent ones of the logic cells C1, C2, C3 and C4.

Each of the logic cells C1, C2, C3 and C4 may include PMOSFET and NMOSFET active regions PR and NR, respectively, which are separated from one another by a device isolation layer ST. For example, the PMOSFET and NMOSFET active regions PR and NR, respectively, of each of the logic cells C1, C2, C3 and C4 may be spaced apart from each other in the second direction D2. Logic cells C1, C2, C3 and C4 that are adjacent to each other in the second direction D2 may be disposed such that the same conductivity type active regions thereof face to each other. For example, the first logic cell C1 may be disposed such that its PMOFET active region PR is adjacent to the PMOSFET active region PR of the third logic cell C3. In this description, any logic cell may be referred herein to as a unit for executing a Boolean logic function (e.g., INVETER, AND, OR, NADN, OR, etc.) or a storage function (e.g., FLIP-FLOP). Although only four logic cells are illustrated, it should be recognized that any number of logic cells may be provided.

In some embodiments, the transistors included in each of the logic cells C1, C2, C3 and C4 may be configured based on a FinFET structure. For example, the PMOSFET and NMOSFET active regions PR and NR in each of the logic cells C1, C2, C3 and C4 may include an active pattern having a fin shape that protrudes from the substrate. A gate electrode constituting the transistor may run across at least one active pattern.

Figure 2A:
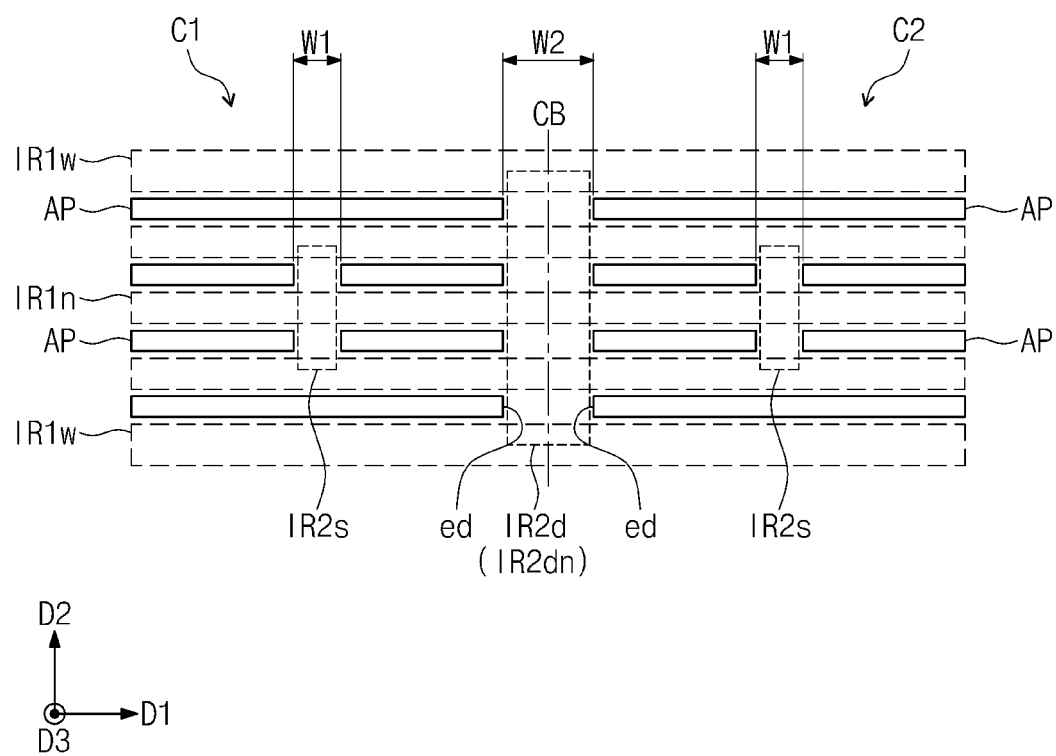
FIG. 2A is a diagram for explaining a configuration of active patterns in a semiconductor device according to some exemplary embodiments of the present inventive concept and, more particularly, a plan view illustrating an example of a boundary section between the first and second logic cells of FIG. 1.

FIG. 2A is a diagram for explaining a configuration of active patterns in a semiconductor device according to some exemplary embodiments of the present inventive concept and, more particularly, a plan view illustrating an example of a boundary section between the first and second logic cells of FIG. 1.

Referring to FIGS. 1 and 2A, there may be provided a plurality of active patterns AP that have a length as measured in the first direction D1, and are disposed along the first and second directions D1 and D2. The active patterns AP may have a fin shape that protrudes from a top surface of the substrate in a third direction D3 (e.g., which is perpendicular to the first and second directions D1 and D2). The active patterns AP of the first logic cell C1 may constitute the PMOSFET active region PR or the NMOSFET active region NR of the first logic cell C1, and the active patterns AP of the second logic cell C2 may constitute the PMOSFET active region PR or the NMOSFET active region NR of the second logic cell C2. The active patterns AP of the first logic cell C1 may have the same conductivity as the active patterns AP of the second logic cell C2.

The device isolation layer ST may separate the active patterns AP from each other. That is, the device isolation layer ST may be provided between adjacent ones of the active patterns AP. In some embodiments, the device isolation layer ST may include first separation regions IR1$n$ and IR1$w$, which extend in the first direction D1 and define first (e.g., relatively long) sidewalls of the active patterns AP, and second separation regions IR2$s$ and IR2$d$ which extend in the second direction D2 and define second (e.g., relatively short) sidewalls of the active patterns AP. In one embodiment, the first separation regions IR1$n$ and IR1$w$ and the second separation regions IR2$s$ and IR2$d$ may be a portion of a single unitary insulation layer. In another embodiment, one or more of the first separation regions IR1$n$ and IR1$w$ and the second separation regions IR2$s$ and IR2$d$ may be portions of separately-formed insulation layers.

The first separation regions IR1$n$ and IR1$w$ may be disposed along the second direction D2, and widths of the active patterns AP may correspond to an interval between the first separation regions IR1$n$ and IR1$w$ along the second direction D2. For example, the first separation regions IR1$n$ and IR1$w$ may be equally spaced apart from each other along the second direction D2, and thus the active patterns AP may have substantially the same width.

In an embodiment, the first separation regions IR1$n$ and IR1$w$ may include a pair of wide first separation regions IR1$w$ disposed on outermost sides along the second direction D2 and narrow first separation regions IR1$n$ disposed between the pair of wide first separation regions IR1$w$. A width of the wide first separation regions IR1$w$ may be greater than that of the narrow first separation regions IR1$n$. The wide first separation regions IR1$w$ may, for example, be utilized to separate the PMOSFET active region PR and the NMOSFET active region NR from each other, to define an area used for the transistor, to separate adjacent logic cells from each other in the second direction D2, or the like, but it should be recognized that the wide first separation regions IR1w may be utilized for other purposes.

The narrow first separation regions IR1n may have at least substantially the same width. The active patterns AP may be spaced apart from each other at the same interval along the second direction D2, with one of the narrow first separation regions IR1n interposed between pairs of adjacent active patterns AP. A single multi-fin transistor may be achieved by a single gate pattern that runs across active patterns AP which are equally spaced apart from each other along the second direction D2. Although only four active patterns AP are illustrated as constituting a single multi-fin transistor that can be achieved by a single gate pattern, it should be recognized that any number of active patterns AP may be provided to constitute a single multi-fin transistor. In other words, although only three narrow first separation regions IR1n are illustrated as being between a pair of wide first separation regions IR1w, it should be recognized that any number of narrow first separation regions IR1n may be between a pair of wide first separation regions IR1w.

The second separation regions IR2s and IR2d may be defined to cross the first separation regions IR1n and IR1w. The second separation region IR2s and IR2d may thus be partially coextensive with the first separation regions IR1n and IR2w. The second separation regions IR2s and IR2d may be disposed along the first direction D1, and lengths of the active patterns AP may correspond to intervals between the second separation regions IR2s and IR2d along the first direction D1. For example, the active patterns AP may have opposing end portions in a length direction that are respectively adjacent to the second separation regions IR2s and IR2d, which are spaced apart from each other along the first direction D1. As shown in figures, the active patterns AP may have various lengths.

In an embodiment, the second separation regions IR2s and IR2d may include a single diffusion break region IR2s provided between pairs of active patterns AP that are spaced apart from each other along the first direction D1 in each of the logic cells C1 and C2, and a double diffusion break region IR2d provided between pairs of logic cells (e.g., the first and second logic cells C1 and C2) that are adjacent to each other along the first direction D1.

The single diffusion break region IR2s may have a first width W1, as measured along the first direction D1. The first width W1 may be defined by an interval between a pair of active patterns AP that are adjacent to each other along the first direction D1 and have the single diffusion break region IR2s interposed there between. In some embodiments, the active patterns AP may have substantially the same planar shape at respective end portions thereof that are adjacent to the single diffusion break region IR2s. End portions of active patterns AP that are adjacent to the same side of a common single diffusion break region IR2s may be aligned with each other along the second direction D2. Accordingly, active patterns AP within pairs of active patterns AP that are adjacent to each other along the first direction D1 across a common single diffusion break region IR2s may be spaced apart from one another by the same interval. That is, the first width W1 of the single diffusion break region IR2s may be uniform (or at least substantially uniform) along the second direction D2.

The double diffusion break region IR2d may have a second width W2, as measured along the first direction D1. The second width W2 may be defined by an interval between active patterns AP that are adjacent to each other along the first direction D1 and have the double diffusion break region IR2d interposed there between. In this description, the second width W2 may correspond to a minimum width of the double diffusion break region IR2d provided between pairs of logic cells that are adjacent to each other in the first direction DL The double diffusion break region IR2d having the second width W2 may also be referred to herein as a narrow double diffusion break region IR2dn.

In some embodiments, the active patterns AP may have substantially the same planar shape at respective end portions thereof that are adjacent to the narrow double diffusion break region IR2dn. In one embodiment, an end portion of an active pattern AP that is adjacent to the narrow double diffusion break region IR2dn may be identical or similar to an end portion of an active pattern AP that is adjacent to the single diffusion break region IR2s.

As viewed in plan, end portions ed of the active patterns AP, adjacent to the narrow double diffusion break region IR2dn, of the first logic cell C1 may be aligned with each other along the second direction D2. Likewise, as viewed in plan, end portions ed of the active patterns AP, adjacent to the narrow double diffusion break region IR2dn, of the second logic cell C2 may be aligned with each other in the second direction D2. The same intervals may then be provided between the active patterns AP adjacent to each other in the first direction D1 with the narrow double diffusion break region IR2dn interposed there between. That is, the second width W2 of the narrow double diffusion break region IR2dn may be uniform (or at least substantially uniform) along the second direction D2. The second width W2 of the narrow double diffusion break region IR2dn may be greater than the first width W1 of the single diffusion break region IR2s.

In one embodiment, the active patterns AP may be formed by a process that includes patterning the substrate to form trenches, wherein the trenches define the active patterns AP. A single patterning process may be performed such that the trenches are formed at the same time. An insulation layer may be provided to fill lower portions of the trenches, thereby forming the first separation regions IR1n and IR1w and the second separation regions IR2s and IR2d. Accordingly, in one embodiment, the active patterns AP and the device isolation layer ST may be formed by a single trench process and a single fill process. A detailed description about the formation of the active patterns AP will be discussed later.

Figure 2B:
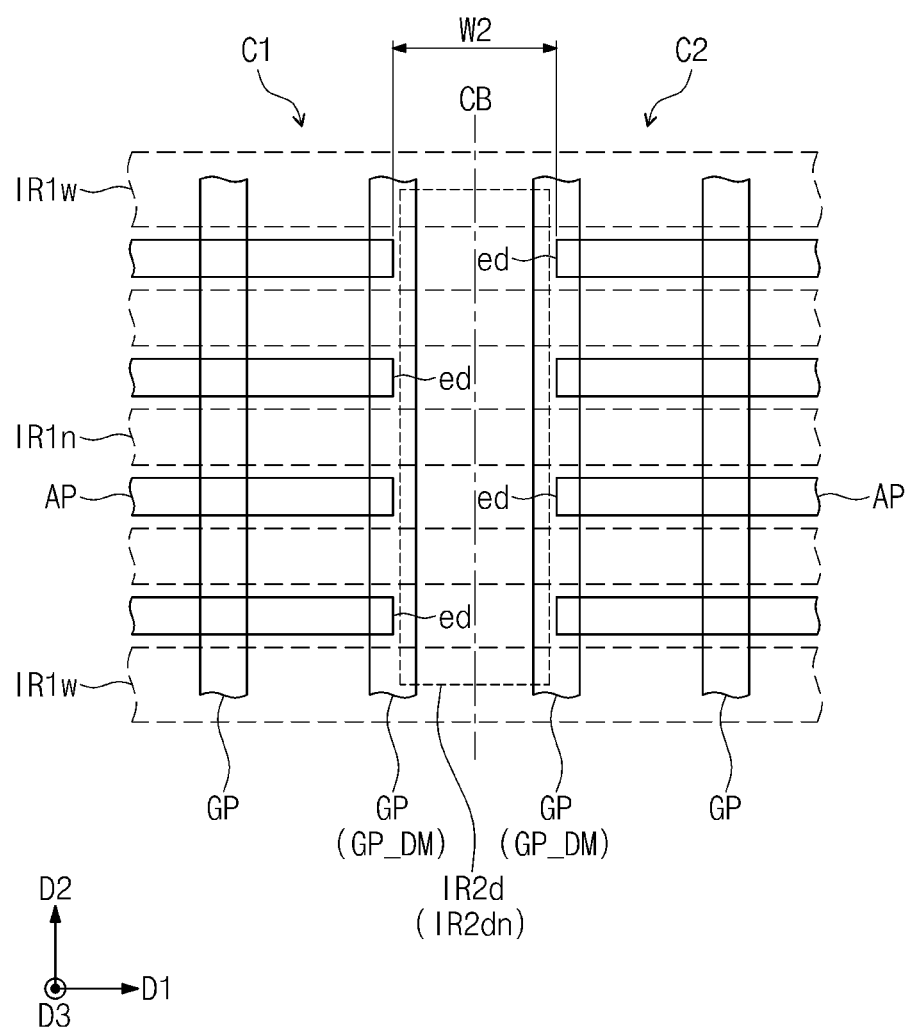
FIG. 2B is a plan view exemplarily illustrating a portion of a semiconductor device including the active patterns of FIG. 2A.

FIG. 2B is a plan view exemplarily illustrating a portion of a semiconductor device including the active patterns of FIG. 2A.

Referring to FIG. 2B, gate patterns GP may be provided to run across the active patterns AP. For example, the gate patterns GP may have line or bar shapes that extend along the second direction D2 and are disposed at a regular interval along the first direction D1. Although not illustrated, each gate pattern GP may include a gate electrode and a gate dielectric pattern.

One or more of the gate patterns GP may overlap the second separation regions IR2s or IR2d. The gate patterns GP overlapping the second separation regions IR2s and IR2d may be referred to herein as dummy gate patterns GP_DM. As not shown, the single diffusion break region IR2s may be overlapped by a single dummy gate pattern GP_DM. The double diffusion break region IR2d may be overlapped by at least two or more dummy gate patterns GP_DM. The narrow double diffusion break region IR2dn may overlap two dummy gate patterns GP_DM. One of the two dummy gate patterns GP_DM may commonly overlap end portions of the active patterns AP, adjacent to the narrow double diffusion break region IR2dn, of the first logic cell C1, and the other of the two dummy gate patterns GP_DM may commonly overlap end portions of the active patterns AP, adjacent to the narrow double diffusion break region IR2dn, of the second logic cell C2. In some embodiments, the second width W2 of the narrow double diffusion break region IR2dn may be either substantially the same as a pitch of the gate patterns GP (e.g., as measured along the first direction D1) or less than the pitch of the gate patterns GP (i.e., such that the narrow double diffusion break region IR2dn is still overlapped by the two dummy gate patterns GP_DM).

Figure 3A:
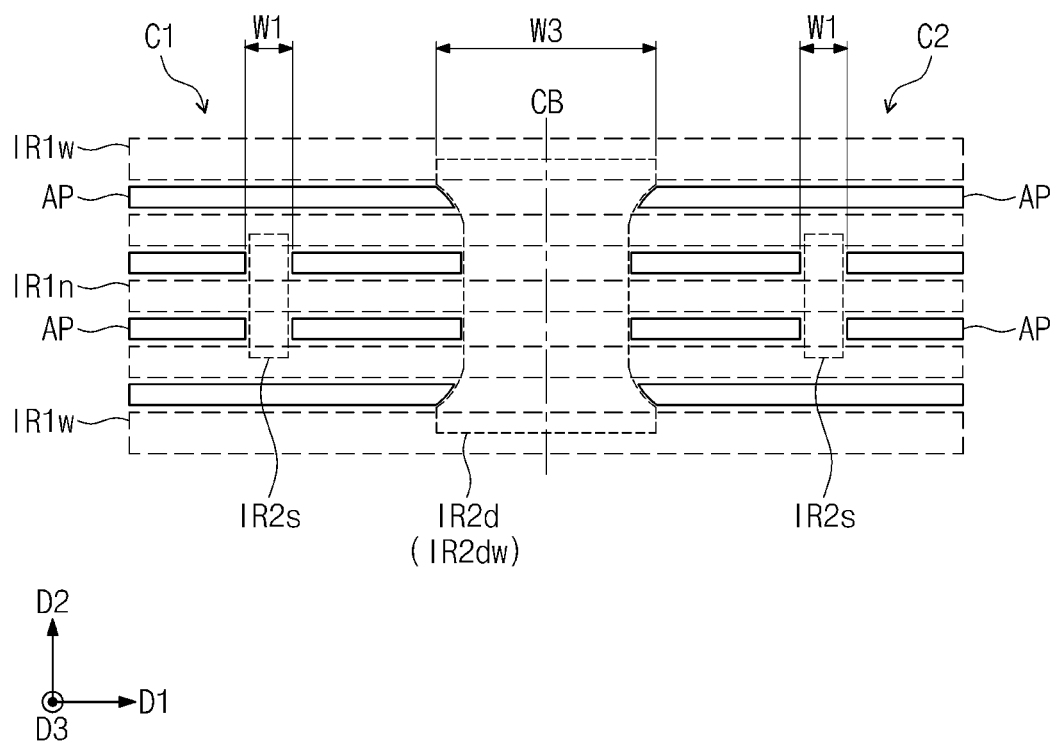
FIG. 3A is a diagram for explaining a configuration of active patterns in a semiconductor device according to some exemplary embodiments of the present inventive concept and, more particularly, a plan view illustrating an example of a boundary section between the first and second logic cells of FIG. 1.
Figure 3B:
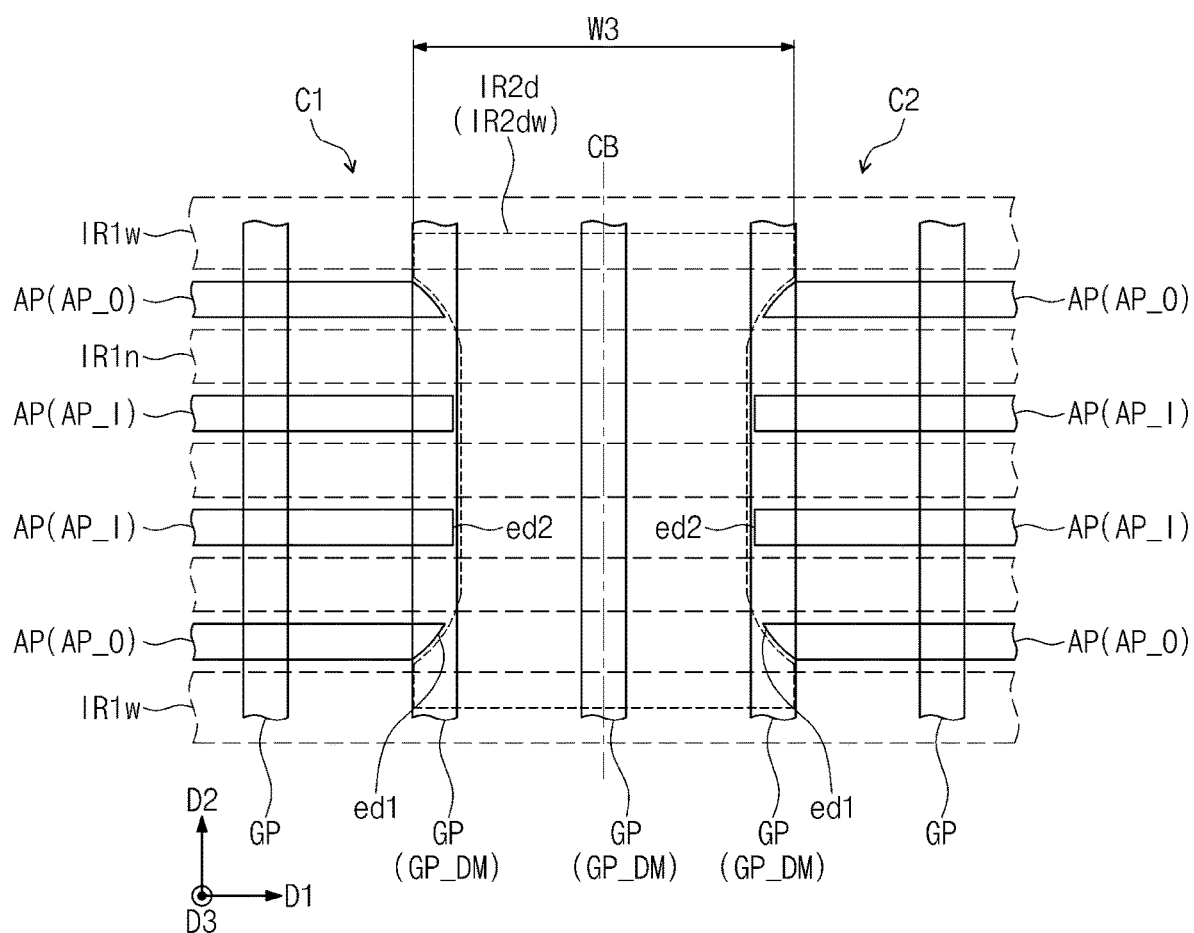
FIG. 3B is a plan view exemplarily illustrating a portion of a semiconductor device including the active patterns of FIG. 3A.

FIG. 3A is a diagram for explaining a configuration of active patterns in a semiconductor device according to some exemplary embodiments of the present inventive concept and, more particularly, a plan view illustrating an example of a boundary section between the first and second logic cells of FIG. 1. FIG. 3B is a plan view exemplarily illustrating a portion of a semiconductor device including the active patterns of FIG. 3A. A repetitive description will be omitted for brevity.

Referring to FIGS. 1 and 3A, the double diffusion break region IR2d may have a third width W3, as measured along the first direction D1, that is defined by intervals between active patterns AP that are adjacent to each other along the first direction D1 and have the double diffusion break region IR2d interposed there between. The third width W3 may be greater than the second width W2 of the narrow double diffusion break region IR2dn (e.g., as discussed with reference to FIGS. 2A and 2B). In other words, the double diffusion break region IR2d may have a width that is greater than the second width W2, and the second width W2 may be considered to be a minimum width of the double diffusion break region IR2d. The double diffusion break region IR2d having the third width W3 may also be referred to herein as a wide double diffusion break region IR2dw.

In some embodiments, the third width W3 of the wide double diffusion break region IR2dw may vary, depending on its position along the second direction D2. End portions of active patterns AP adjacent to the wide double diffusion break region IR2dw may have different shapes, which vary according to respective positions along the second direction D2. This will be further discussed in detail with reference to FIG. 3B.

Referring to FIG. 3B, the active patterns AP adjacent to the wide double diffusion break region IR2dw may include outermost active patterns AP_O, positioned on outermost sides along the second direction D2, and inner active patterns AP_I, positioned between the outermost active patterns AP_O. The outermost active patterns AP_O may have first end portions ed1 adjacent to a side of the wide double diffusion break region IR2dw, and the inner active patterns AP_I may have second end portions ed2 adjacent to the side of the wide double diffusion break region IR2dw. The first end portions ed1 and the second end portions ed2 may be offset from one another along the first direction D1. For example, the first logic cell C1 may have inner and outermost active patterns AP_I and AP_O, which have second and first end portions ed2 and ed1, respectively, that are adjacent to the same side of the wide double diffusion break region IR2dw, and the second end portions ed2 may protrude deeper towards the cell boundary CB than the first end portions ed1. Likewise, the second logic cell C2 may have inner and outermost active patterns AP_I and AP_O, which have second and first end portions ed2 and ed1, respectively, that are adjacent to the same side of the wide double diffusion break region IR2dw, and the second end portions ed2 may protrude deeper towards the cell boundary CB than the first end portions ed1. Accordingly, relatively large intervals may be provided between pairs of outermost active patterns AP_O that are adjacent to each other along the first direction D1 and spaced apart from each other by the wide double diffusion break region IR2dw, and relatively small intervals may be provided between pairs of inner active patterns AP_I that are adjacent to each other in the first direction D1 and spaced apart from each other by the wide double diffusion break region IR2dw. In other words, the third width W3 of the portion of the wide double diffusion break region IR2dw adjacent to the outermost active patterns AP_O may be greater than the third width W3 of the portion of the wide double diffusion break region IR2dw adjacent to the inner active patterns AP_I.

The outermost active patterns AP_O may have a first shape at respective end portions ed1 adjacent to the wide double diffusion break region IR2dw, and the inner active patterns AP_I may have a second shape at respective end portions ed2 adjacent to the wide double diffusion break region IR2dw. The first shape of the outermost active patterns AP_O may be different from the second shape of the inner active patterns AP_I. For example, the end portions ed1 of the outermost active patterns AP_O may have a rounded shape, while the end portions of the inner active patterns AP_I may have a planar shape with, e.g., angulated corners.

In some embodiments, the wide double diffusion break region IR2dw may be overlapped by at least three or more dummy gate patterns GP_DM. For example, as shown in FIG. 3B, the wide double diffusion break region IR2dw may overlap three dummy gate patterns GP_DM. One of the three dummy gate patterns GP_DM overlapping the wide double diffusion break region IR2dw may commonly overlap the end portions ed1 and ed2 of the active patterns AP, adjacent to the wide double diffusion break region IR2dw, of the first logic cell C1, and another of the three dummy gate patterns GP_DM overlapping the wide double diffusion break region IR2dw may commonly overlap the end portions ed1 and ed2 of the active patterns AP, adjacent to the wide double diffusion break region IR2dw, of the second logic cell C2. The other of the three dummy gate patterns GP_DM may be disposed on the wide double diffusion break region IR2dw (e.g., so as to be at an overlap position with the cell boundary CB). The third width W3 of the wide double diffusion break region IR2dw may be either substantially the same as twice the pitch of the gate patterns GP or less than twice the pitch of the gate patterns GP (i.e., such that the wide double diffusion break region IR2dw is still overlapped by the three dummy gate patterns GP_DM). The third width W3 of the wide double diffusion break region IR2dw may increase, depending upon the number of the dummy gate patterns GP_DM overlapping the wide double diffusion break region IR2dw.

As discussed above, the shape and configuration of the end portions of the active patterns AP adjacent to the wide double diffusion break region IR2dw may be different from those of the end portions of the active pattern AP adjacent to the narrow double diffusion break region IR2dn. This difference may be due to the difference in a manufacturing method thereof, which will be further discussed in detail later.

Figure 4:
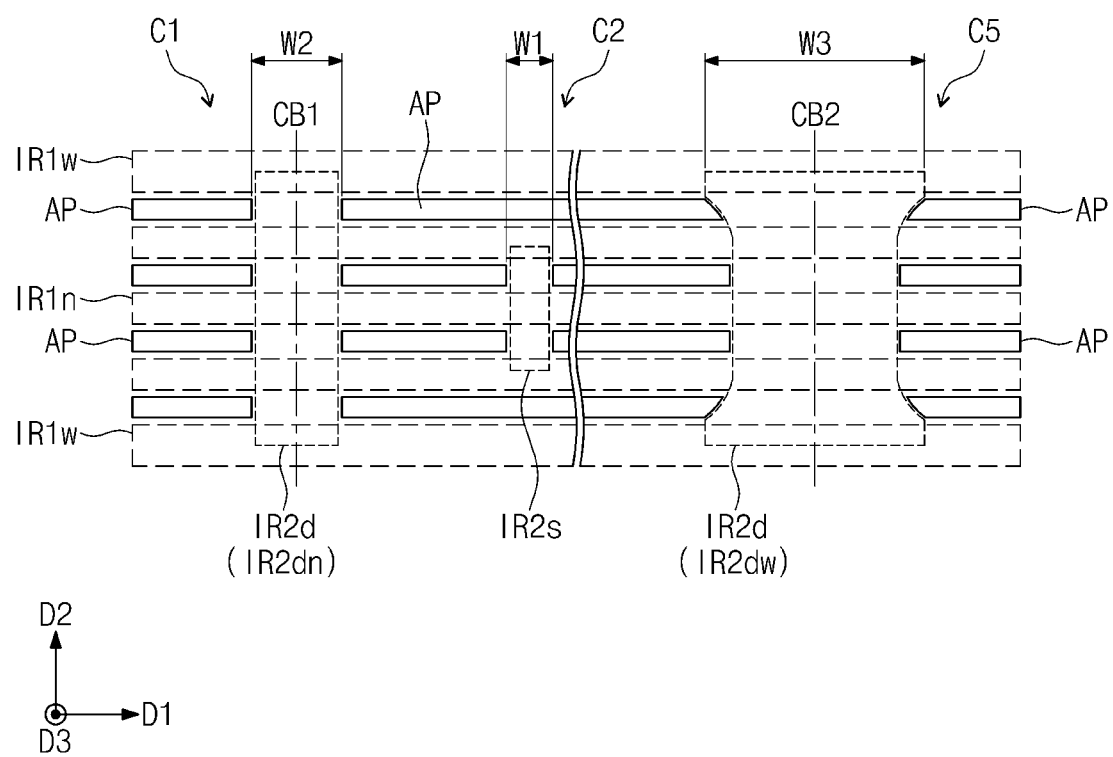
FIG. 4 is a plan view illustrating an example of arrangement of a double diffusion break region in a semiconductor device according to some exemplary embodiments of the present inventive concept.

FIG. 4 is a plan view illustrating an example of arrangement of a double diffusion break region in a semiconductor device according to some exemplary embodiments of the present inventive concept.

Various sizes and widths may, as needed, be implemented on the double diffusion break region IR2d between the logic cells adjacent to each other in the first direction D1. For example, the narrow double diffusion break region IR2$dn$ may be provided to have the second width W2 between one pair of logic cells adjacent to each other along the first direction D1, and the wide double diffusion break region IR2$dw$ may be provided to have the third width W3 greater than the second width W2 between another pair of logic cells adjacent to each other along the first direction D1. The arrangement of the double diffusion break regions IR2$d$ will be hereinafter discussed in further detail with reference to FIG. 4.

Referring to FIG. 4, the semiconductor device according to some exemplary embodiments of the present inventive concept may include first, second and fifth logic cells C1, C2 and C5, respectively, provided on the substrate. The first, second and fifth logic cells C1, C2 and C5 may be disposed along the first direction D1. For example, the first and fifth logic cells C1 and C5 may be spaced apart from each other along the first direction D1 with the second logic cell C2 interposed there between. The first and second logic cells C1 and C2 may share a first cell boundary CB1, and the second and fifth logic cells C2 and C5 may share a second cell boundary CB2.

In one embodiment, and as exemplarily illustrated, the narrow double diffusion break region IR2$dn$ may be provided between the first logic cell C1 and the second logic cell C2, and the wide double diffusion break region IR2$dw$ may be provided between the second logic cell C2 and the fifth logic cell C5. In other embodiments, however, a narrow double diffusion break region IR2$dn$ may be provided between the first and second logic cells C1 and C2 and between the second and fifth logic cells C2 and C5, or a wide double diffusion break region IR2$dw$ may be provided between the first and second logic cells C1 and C2 and between the second and fifth logic cells C2 and C5. In another embodiment, the wide double diffusion break region IR2$dw$ may be provided between the first logic cell C1 and the second logic cell C2, and the narrow double diffusion break region IR2$dn$ may be provided between the second logic cell C2 and the fifth logic cell C5.

FIGS. 5A to 15A are plan views illustrating a method for manufacturing a semiconductor device including active patterns according to some exemplary embodiments of the present inventive concept. FIGS. 5B to 15B are cross-sectional views taken along line I-I' of FIGS. 5A to 15B, respectively. FIGS. 5C to 15C are cross-sectional views taken along line II-II' of FIGS. 5A to 15A, respectively.

Figure 5A:
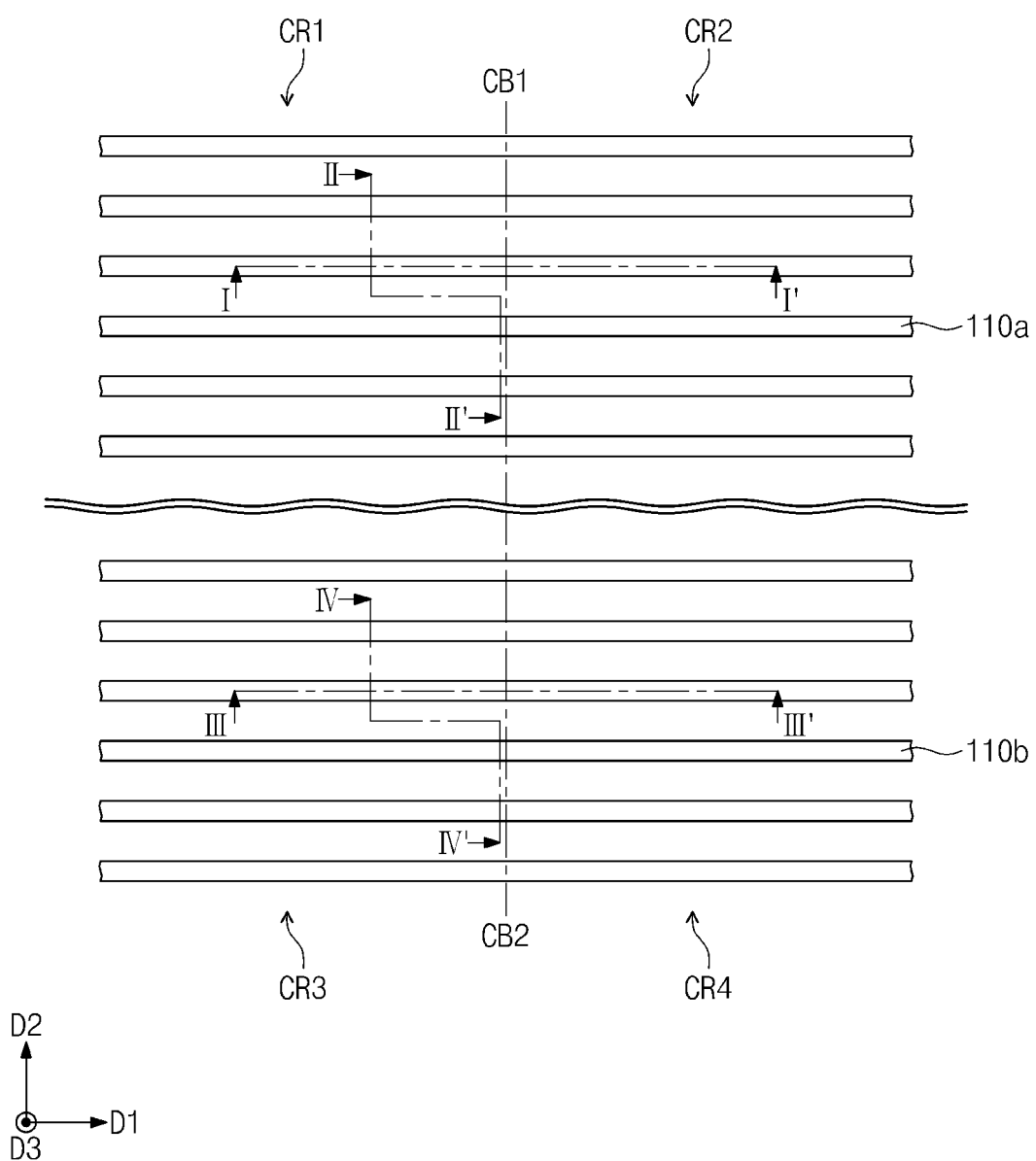
Figure 5B:
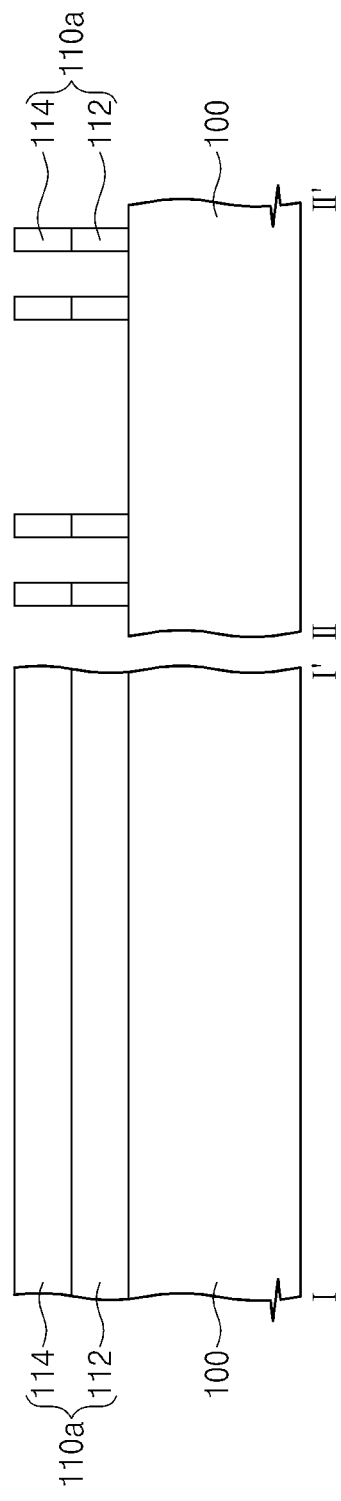
Figure 5C:
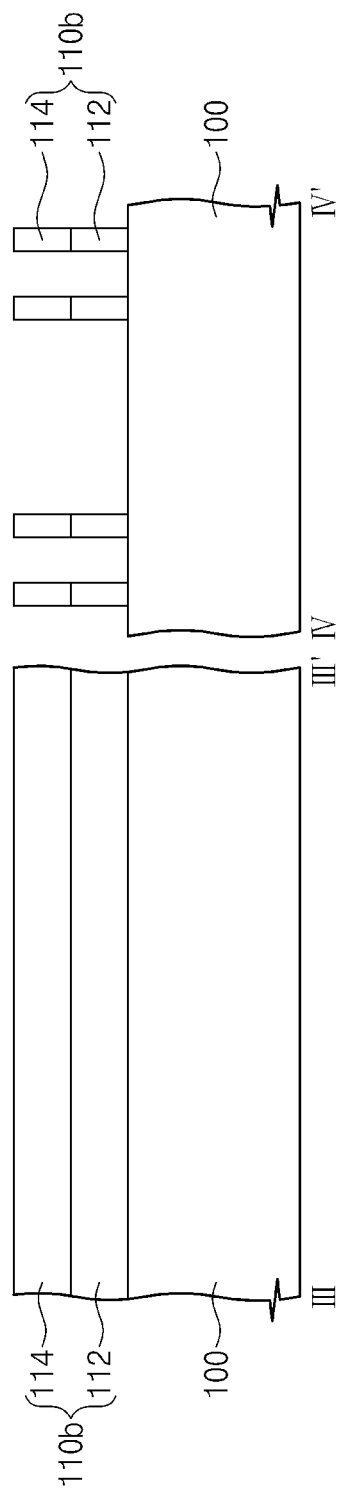

Referring to FIGS. 5A, 5B and 5C, a substrate 100 may be provided to include first, second, third and fourth logic cell regions CR1, CR2, CR3 and CR4, respectively. For example, the first and second logic cell regions CR1 and CR2 may be zones where a pair of logic cells adjacent to each other in a first direction D1 are formed, and the third and fourth logic cell regions CR3 and CR4 may be zones where another pair of logic cells adjacent to each other in the first direction D1 are formed. The first and second logic cell regions CR1 and CR2 may share a first cell boundary CB1, and the third and fourth logic cell regions CR3 and CR4 may share a second cell boundary CB2. Alternatively, the first logic cell region CR1 may be a zone where the first logic cell C1 of FIG. 4 is formed, the second and third logic cell regions CR2 and CR3 may be zones where the second logic cell C2 of FIG. 4 is formed, and the fourth logic cell region CR4 may be a zone where the fifth logic cell C5 of FIG. 4 is formed. In this case, the first cell boundary CB1 of FIG. 5A may correspond to the first cell boundary CB1 of FIG. 4, and the second cell boundary CB2 of FIG. 5A may correspond to the second cell boundary CB2 of FIG. 4. The substrate 100 may be a semiconductor substrate or a compound semiconductor substrate (e.g., including silicon, germanium, silicon-germanium, or the like or any combination thereof).

Through subsequent processes, the narrow double diffusion break region IR2$dn$ discussed with reference to FIGS. 2A and 2B can be formed in the substrate 100 between the first and second logic cell regions CR1 and CR2, and the wide double diffusion break region IR2$dw$ discussed with reference to FIGS. 3A and 3B can be formed in the substrate 100 between the third and fourth logic cell regions CR3 and CR4. Also discussed below are embodiments, based on the case that different logic cells are formed in the first to fourth logic cell regions CR1, CR2, CR3 and CR4.

Referring to FIG. 5A, line mask patterns 110$a$ and 110$b$ may be formed on the substrate 100 and extend parallel to each other along the first direction D1. For example, the line mask patterns 110$a$ and 110$b$ may extend along the first direction D1 and be spaced apart from each other along the second direction D2. The line mask patterns 110$a$ and 110$b$ may be spaced apart from each other at substantially the same interval along the second direction D2. The line mask patterns 110$a$ and 110$b$ may include first line mask patterns 110$a$, which are formed on the first and second logic cell regions CR1 and CR2, and second line mask patterns 110$b$, which are formed on the third and fourth logic cell regions CR3 and CR4. The first line mask patterns 110$a$ may run across the first and second logic cell region CR1 and CR2 along the first direction D1, and the second line mask patterns 110$b$ may run across the third and fourth logic cell regions CR3 and CR4 along the first direction D1.

In an embodiment, and with reference to FIGS. 5B and 5C, each of the first and second line mask patterns 110$a$ and 110$b$ may include a lower line mask pattern 112 and an upper line mask pattern 114 that have different etch selectivity from each other and are sequentially staked on the substrate 100. The lower line mask pattern 112 may be formed of a material having an etch selectivity with respect to the substrate 100. For example, the lower line mask pattern 112 may include at least one of silicon oxide, silicon nitride, and silicon oxynitride. The upper line mask pattern 114 may be formed of a material having an etch selectivity with respect to the lower line mask pattern 112 (e.g., polysilicon). In the present embodiment, each of the line mask patterns 110$a$ and 110$b$ is illustrated to have a two-layered stack structure, but the present inventive concept is not limited thereto. In certain embodiments, each of the line mask patterns 110$a$ and 110$b$ may include a single-layered structure, a three-layered stack structure, etc. The line mask patterns 110$a$ and 110$b$ may be formed using, for example, a double patterning technique or a quadruple patterning technique.

Figure 6A:
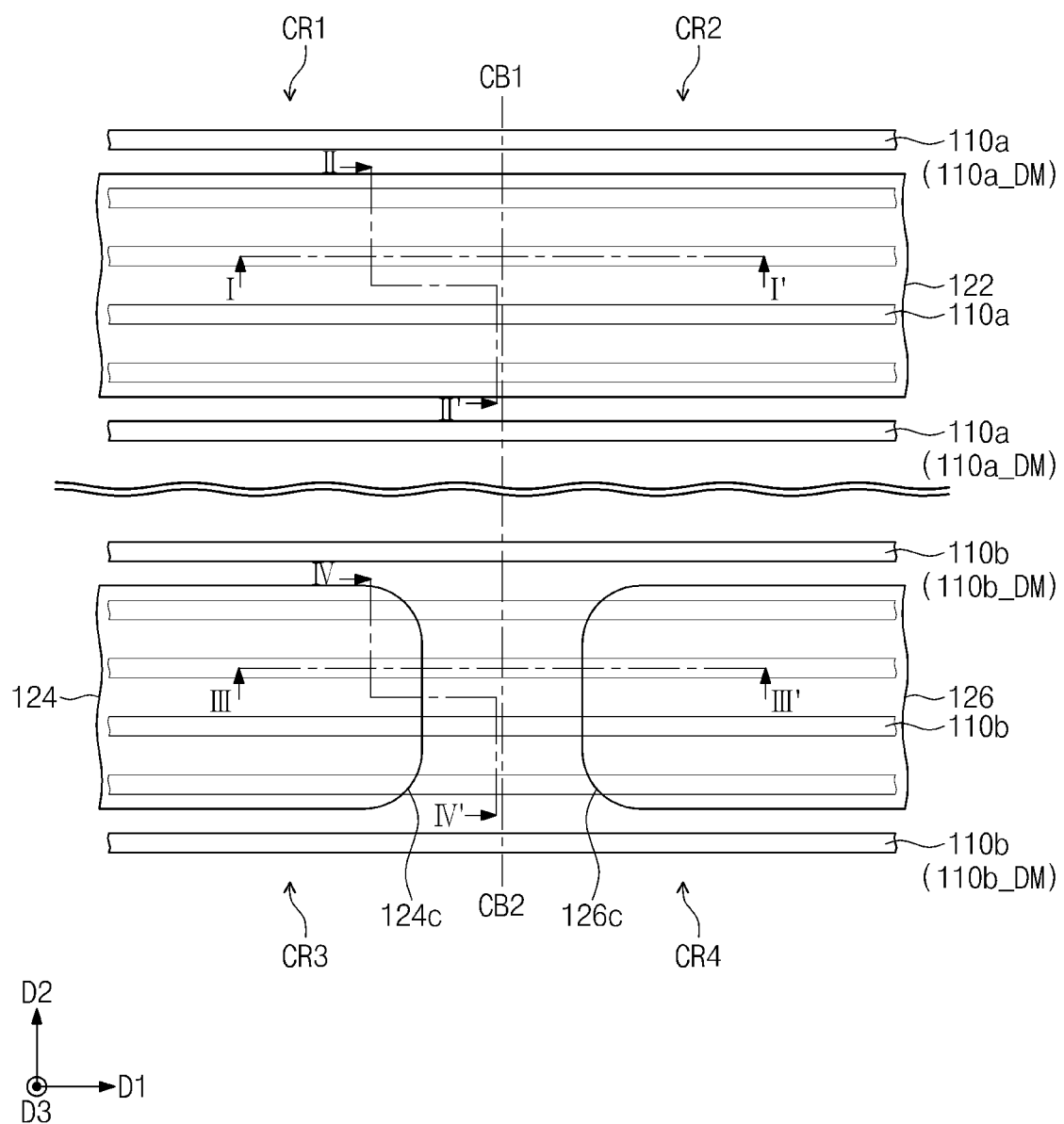

Referring to FIGS. 6A, 6B and 6C, lower separation mask patterns 122, 124 and 126 may be formed on the substrate 100. In an embodiment, the lower separation mask patterns 122, 124 and 126 may be formed by forming, on an entire surface of the substrate 100, a lower separation mask layer covering the line mask patterns 110$a$ and 110$b$ and then patterning the lower separation mask layer. The lower separation mask layer may be patterned by, for example, forming photoresist patterns on the lower separation mask layer so as to define the lower separation mask patterns 122, 124 and 126 and then etching the lower separation mask layer using the photoresist patterns as an etch mask. The lower separation mask layer may be formed of, for example, an SOH (spin-on hardmask) layer, but it should be recognized that the lower separation mask layer may be formed of any other suitable material.

In some embodiments, the lower separation mask patterns 122, 124 and 126 may include a first lower separation mask pattern 122 running across the first and second logic cell regions CR1 and CR2 along the first direction D1, a second lower separation mask pattern 124 formed on the third logic cell region CR3, and a third lower separation mask pattern 126 formed on the fourth logic cell region CR4 and spaced apart from the second lower separation mask pattern 124 along the first direction D1 across the second cell boundary CB2. The second and third lower separation mask patterns 124 and 126 may be formed on the third and fourth logic cell regions CR3 and CR4, respectively, while being separated from each other with the second cell boundary CB2 interposed there between. However, the first lower separation mask pattern 122 may be formed as a single unitary body (e.g., including lower separation mask patterns formed on the first and second logic cell regions CR1 and CR2, which are integrally combined with each other).

The first lower separation mask pattern 122 may cover a plurality of the first line mask patterns 110*a* (e.g., four first line mask patterns 110*a*, as exemplarily shown in FIG. 6A) arranged along the second direction D2 on the first and second logic cell regions CR1 and CR2. The second lower separation mask pattern 124 may cover portions of a plurality of the second line mask patterns 110*b* (e.g., four second line mask patterns 110*b*, as exemplarily shown in FIG. 6A) arranged along the second direction D2 on the third logic cell region CR3. The third lower separation mask pattern 126 may cover (e.g., four second line mask patterns 110*b*, as exemplarily shown in FIG. 6A) arranged along the second direction D2 on the fourth logic cell region CR4. Accordingly, different portions of the plurality of the second line mask patterns 110*b* may be covered by the second and third lower separation mask patterns 124 and 126. The second and third lower separation mask patterns 124 and 126 may be spaced apart from each other at an interval that may correspond to the third width W3 of the wide double diffusion break region IR2*dw* (e.g., as explained above with reference to FIGS. 3A and 3B). In some embodiments, the second and third lower separation mask patterns 124 and 126 may have end portions that face each other with the second cell boundary CB2 interposed there between, and the end portions of the second and third lower separation mask patterns 124 and 126 may have rounded corners 124*c* and 126*c*, respectively. The rounded corners 124*c* and 126*c* are formed due to the characteristics of photoresist process when the photoresist patterns are formed to define the second and third lower separation mask patterns 124 and 126.

The first lower separation mask pattern 122 may expose the first line mask patterns 110*a* (also referred to herein as dummy first line mask patterns 110*a*_DM) positioned on opposing sides of the first lower separation mask pattern 122 along the second direction D2. Likewise, the second and third lower separation mask patterns 124 and 126 may expose the second line mask patterns 110*b* (also referred to herein as dummy second line mask patterns 110*b*_DM) positioned on opposing sides of the second and third lower separation mask patterns 124 and 126 along the second direction D2, as well as portions of the second line mask patterns 110*b* between the second and third lower separation mask patterns 124 and 126.

Figure 7A:
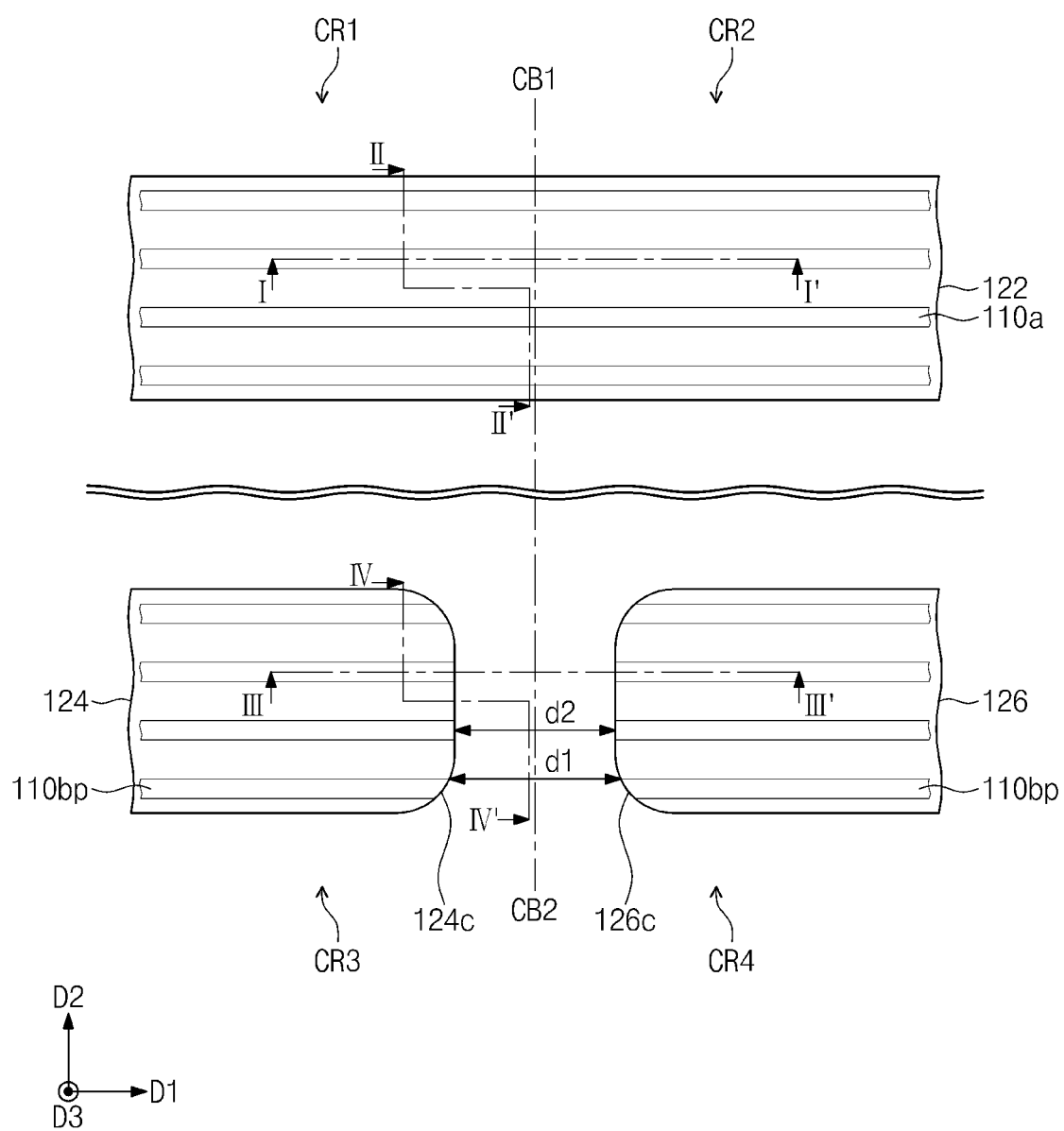

Referring to FIGS. 7A, 7B and 7C, a first etch process may be performed to completely remove the dummy first and second line mask patterns 110*a*_DM and 110*b*_DM using the lower separation mask patterns 122, 124 and 126 as an etch mask. The first etch process may also remove exposed portions of the second line mask patterns 110*b* from between the second and third lower separation mask patterns 124 and 126, to thereby form preliminary second hardmask patterns 110*bp*. Accordingly, the first etch process may divide each of the second line mask patterns 110*b* into preliminary second hardmask patterns 110*bp*, which are spaced apart from each other (e.g., so as to be adjacent to one another along the first direction D1) with the second cell boundary CB2 interposed there between. The first etch process may, for example, include an anisotropic dry etch process. The first etch process may also partially remove an upper portion of the substrate 100.

In some embodiments, an interval may be provided between the adjacent preliminary second hardmask patterns 110*bp*, and the interval may vary along the second direction D2. For example, an interval d1 may be provided between a pair of the preliminary second hardmask patterns 110*bp* positioned on outermost sides, and an interval d2 less than the interval d1 may be provided between another pair of the preliminary second hardmask patterns 110*bp*. The preliminary second hardmask patterns 110*bp* may have respective end portions adjacent to the second cell boundary CB2, and the end portions of the preliminary second hardmask patterns 110*bp* may have shapes that conform to shapes of the end portions of the second and third lower separation mask patterns 124 and 126. For example, the preliminary second hardmask patterns 110*bp* may have rounded end portions adjacent to the corners 124*c* and 126*c* of the second and third lower separation mask patterns 124 and 126.

Figure 8A:
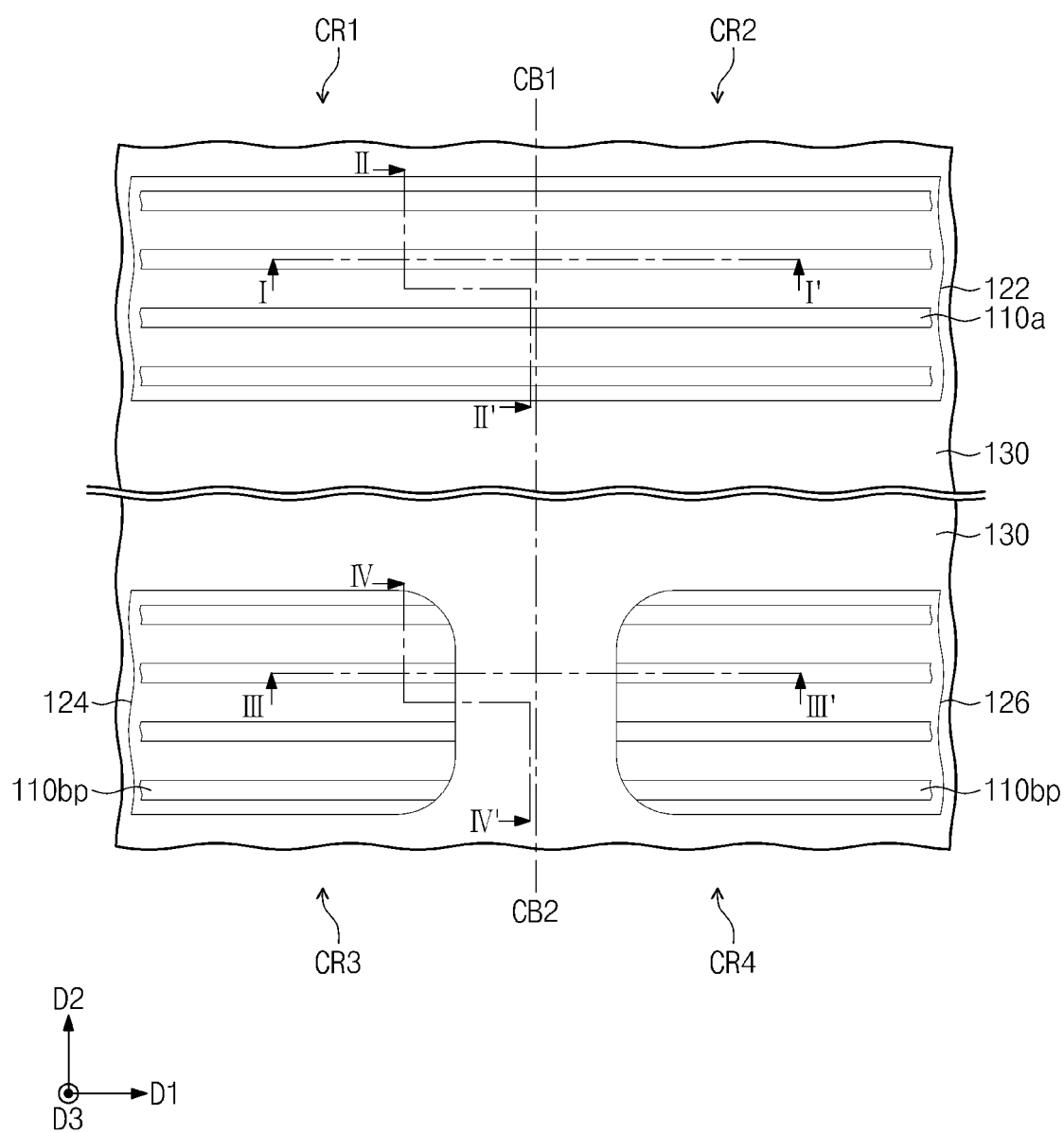
Figure 8B:
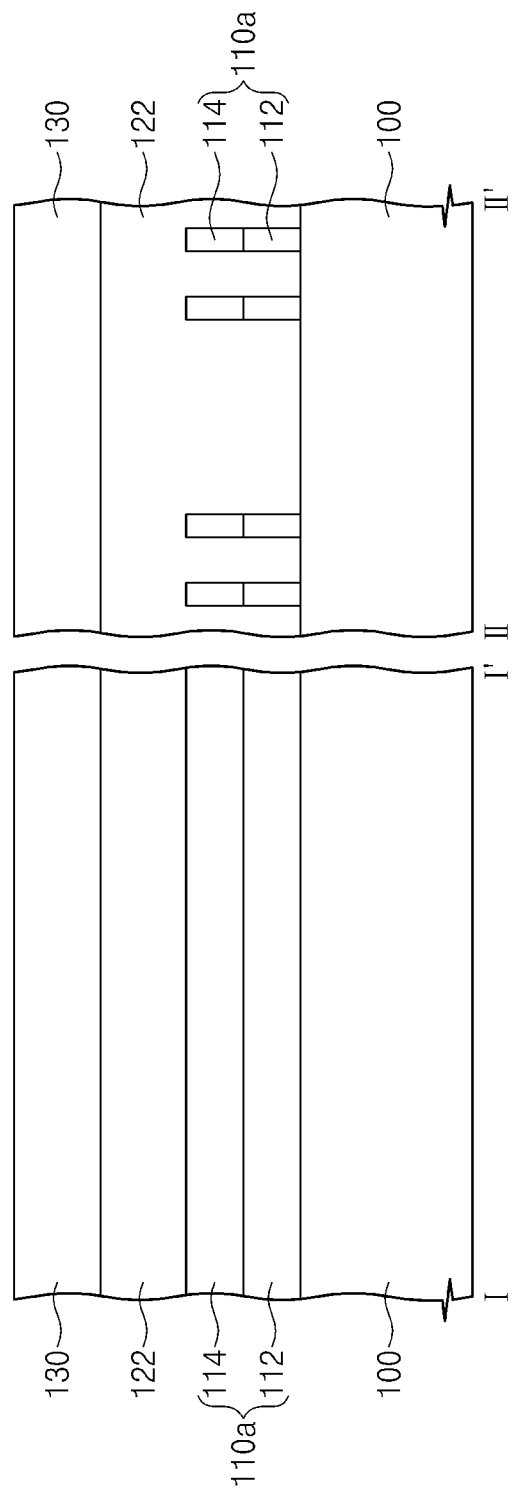
Figure 8C:
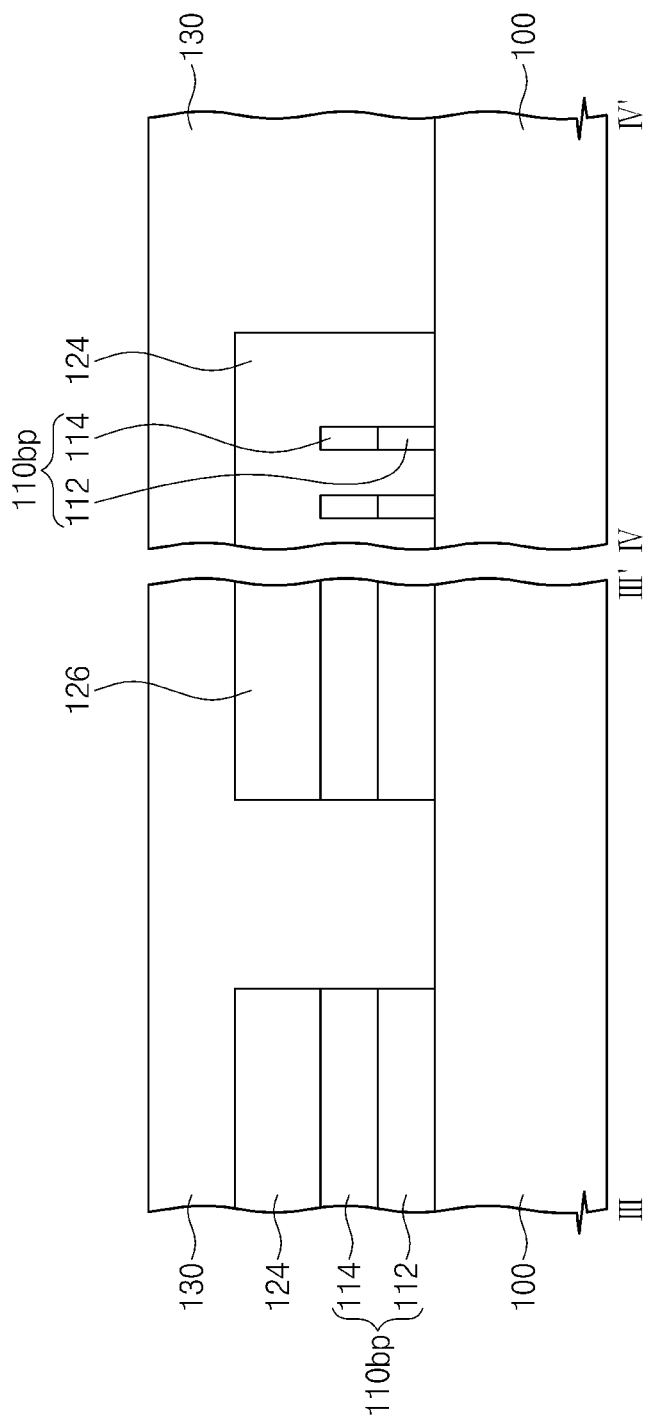

Referring to FIGS. 8A, 8B and 8C, an upper separation mask layer 130 may be formed on the entire surface of the substrate 100. The upper separation mask layer 130 may cover the first, second and third lower separation mask patterns 122, 124 and 126, and also fill spaces there between. The upper separation mask layer 130 may be formed of a material that is the same as that of the lower separation mask layer (e.g., an SOH layer).

Figure 9A:
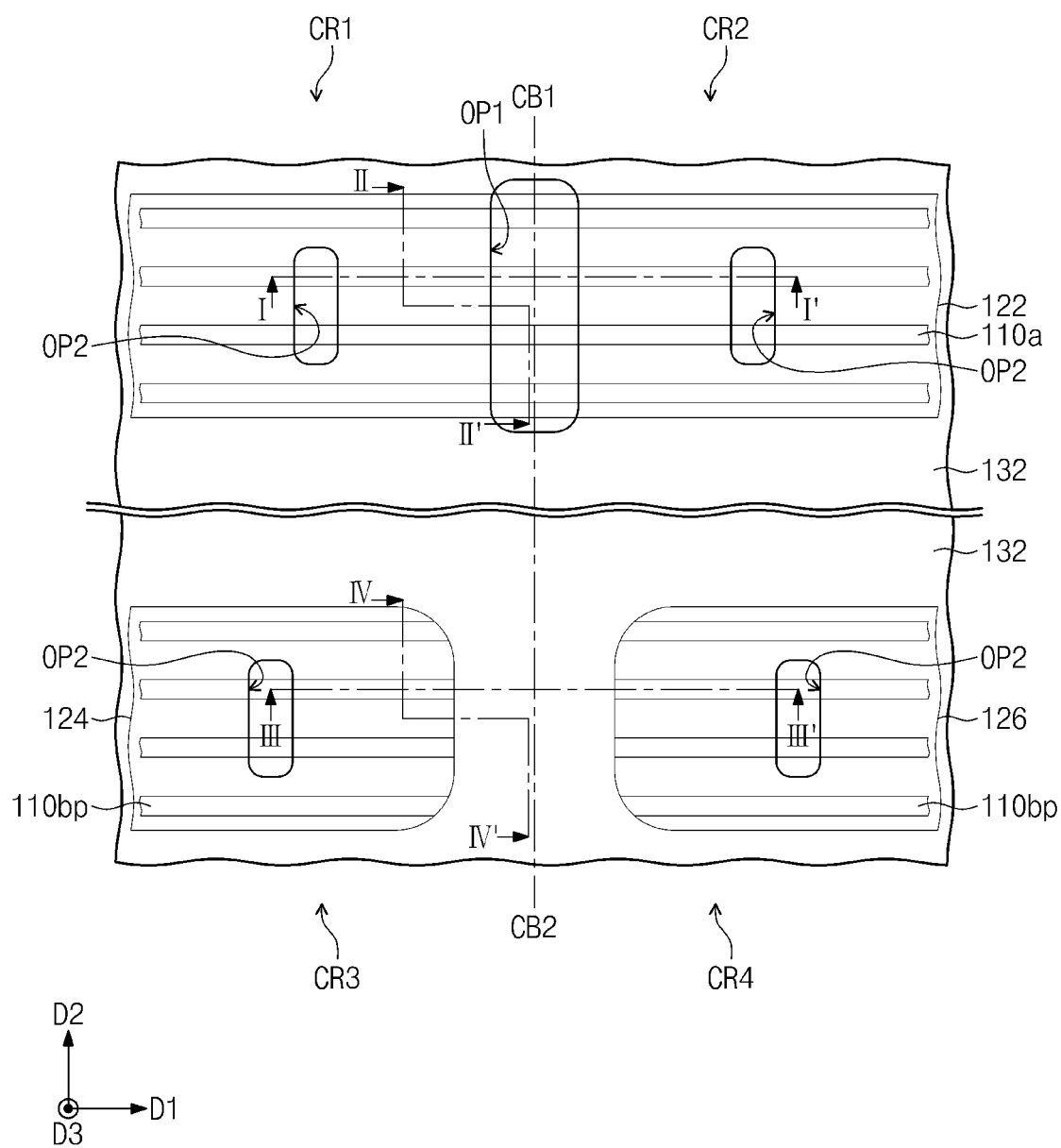
Figure 9B:
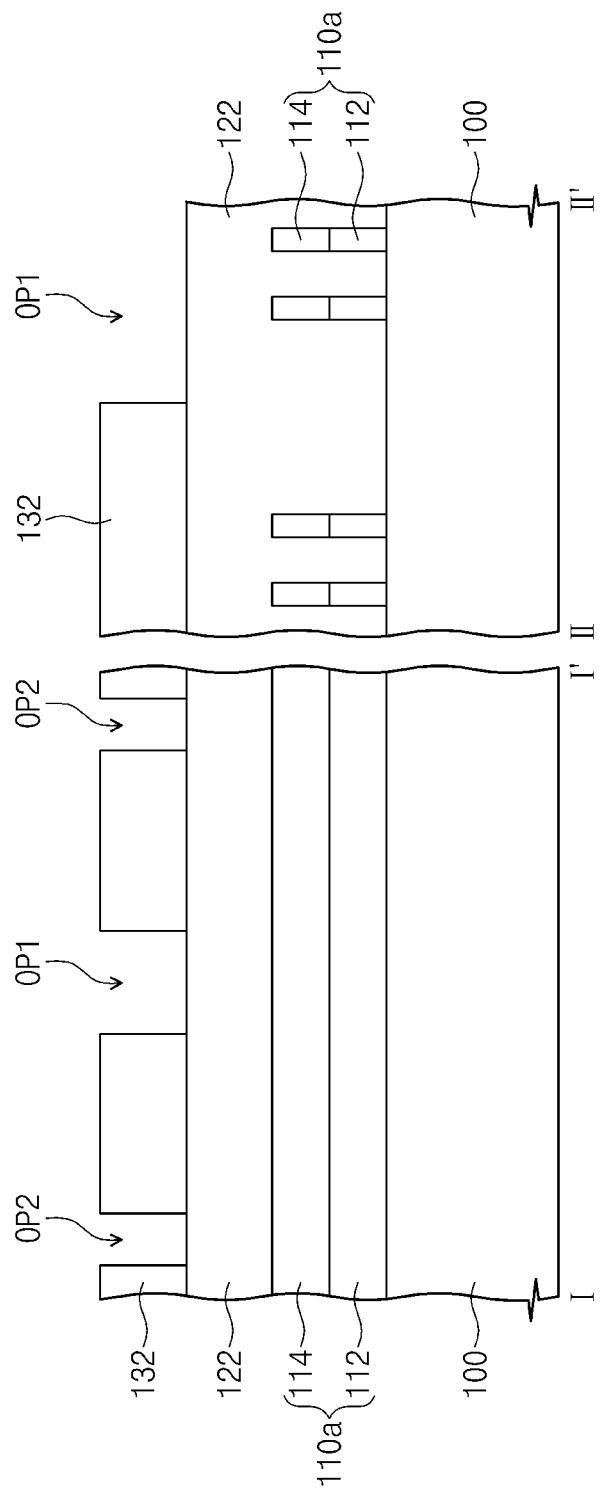
Figure 9C:
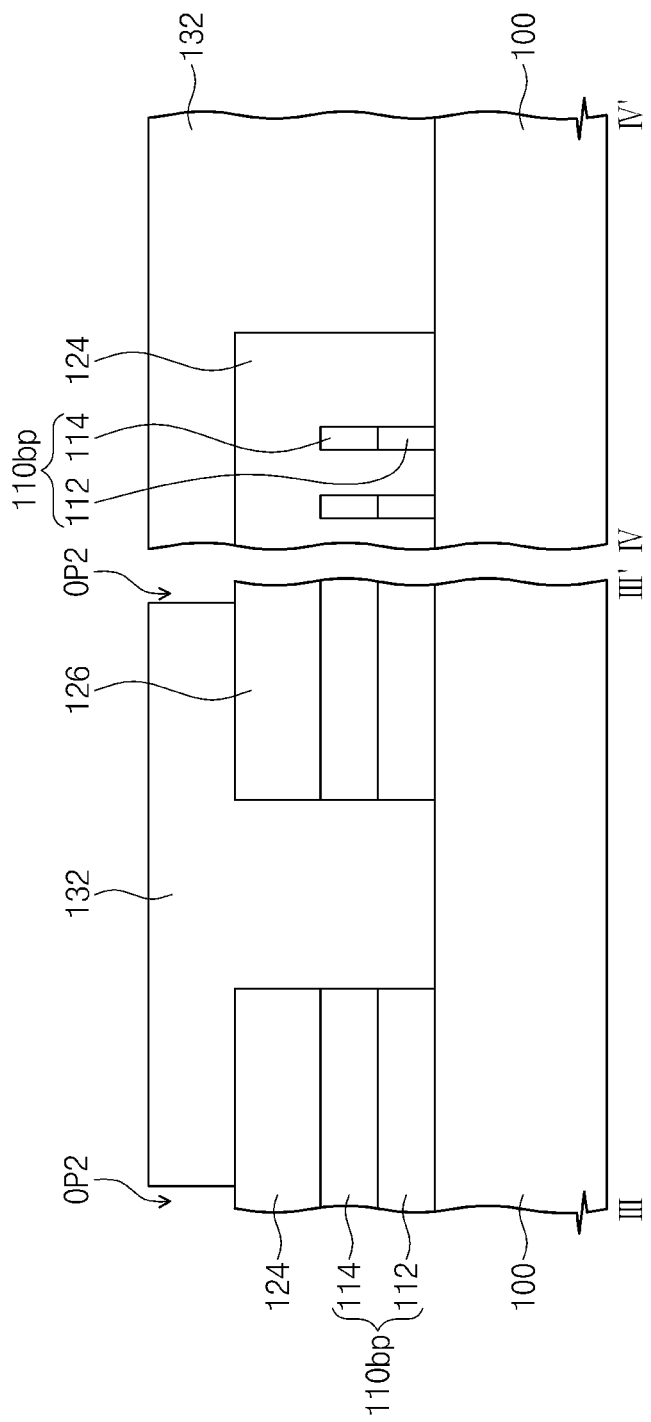

Referring to FIGS. 9A, 9B and 9C, the upper separation mask layer 130 may be patterned to form an upper separation mask pattern 132. The upper separation mask pattern 132 may include a plurality of openings that expose the lower separation mask patterns 122, 124 and 126. In an embodiment, the upper separation mask layer 130 may be patterned by a process that includes forming, on the upper separation mask layer 130, photoresist patterns exposing zones where the openings OP1 and OP2 are to be formed and then etching the upper separation mask layer 130 using the photoresist patterns as an etch mask.

In some embodiments, the openings may include a first opening OP1 that commonly exposes portions of the first lower separation mask pattern 122 on the first and second logic cell regions CR1 and CR2, and a plurality of second openings OP2 that expose the first to third separation mask patterns 122, 124 and 126 on corresponding ones of the first to fourth logic cells CR1, CR2, CR3 and CR4. The first opening OP1 may be positioned on the first cell boundary CB1, and the second openings OP2 may be positioned so as to be spaced apart from the first and second cell boundaries CB1 and CB2.

The first opening OP1 may have a rectangular shape that runs across the first lower separation mask pattern 122 along the second direction D2. For example, the first opening OP1 may overlap four of the first line mask patterns 110*a* disposed along the second direction D2. A planar shape may be formed on an overlapping area between the first opening OP1 and each of the first line mask patterns 110*a*. As viewed in plan, the first opening OP1 may have rounded corners due to the characteristics of the photolithography process. In some embodiments, the length of the first opening OP1 (e.g., as measured along the second direction D2) may be adjusted to ensure that the rounded corners of the first opening OP1 do not overlap the first line mask patterns 110*a*. As a result, a boundary of areas where the first opening OP1 overlaps each of the first line mask patterns 110*a* may extend in a straight line. The first opening OP1 may have a width whose size corresponds to that of the second width W2 of the wide double diffusion break region IR2*dw*.

Although each of the second openings OP2 is illustrated as overlapping either two of the first line mask patterns 110*a* or two of the preliminary second hardmask patterns 110*bp*, it should be recognized that any of the second openings OP2 may overlap any number of first or second line mask patterns 110*a* or 110*b*. The second openings OP2 may have various lengths. For example, each of the second openings OP2 may have a rectangular shape with rounded corners, and have a long axis extending along the second direction D2. A planar shape may be formed where the first line mask patterns 110*a* are overlapped by the second openings OP2 in the first and second logic cell regions CR1 and CR2. Likewise, a planar shape may be formed where the preliminary second hardmask patterns 110*bp* are overlapped by the second openings OP2 in the third and fourth logic cell regions CR3 and CR4. Each of the second openings OP2 may have a width less than the width of the first opening OP1. For example, the second opening OP2 may have a width (e.g., as measured along the first direction D1) whose size corresponds to that of the first width W1 of the single diffusion break region IR2*s* discussed with reference to FIGS. 2A and 2B. Alternatively, one or all of the second openings OP2 may not be provided on the logic cell regions CR1, CR2, CR3 and CR4.

Figure 10A:
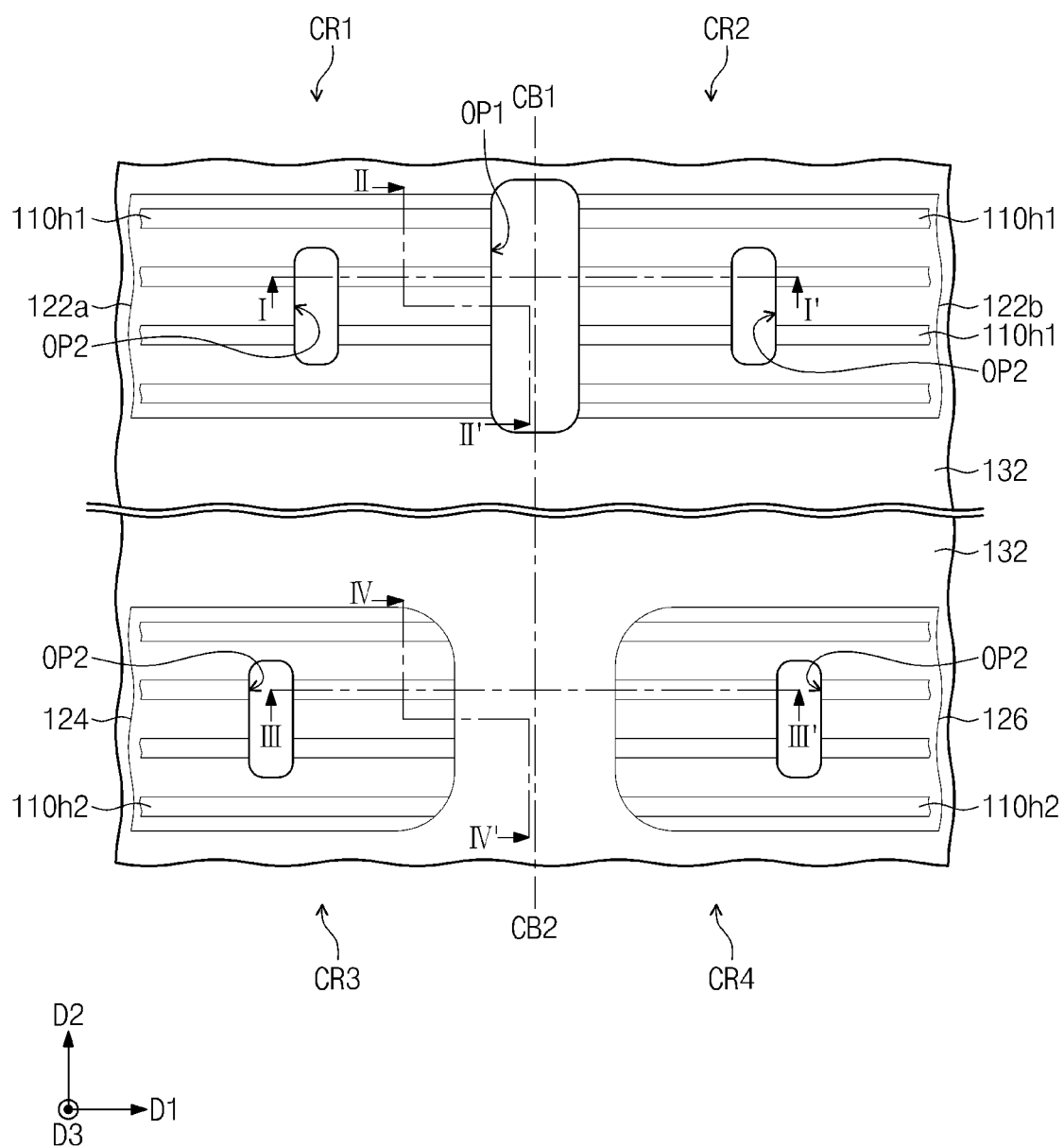
Figure 10B:
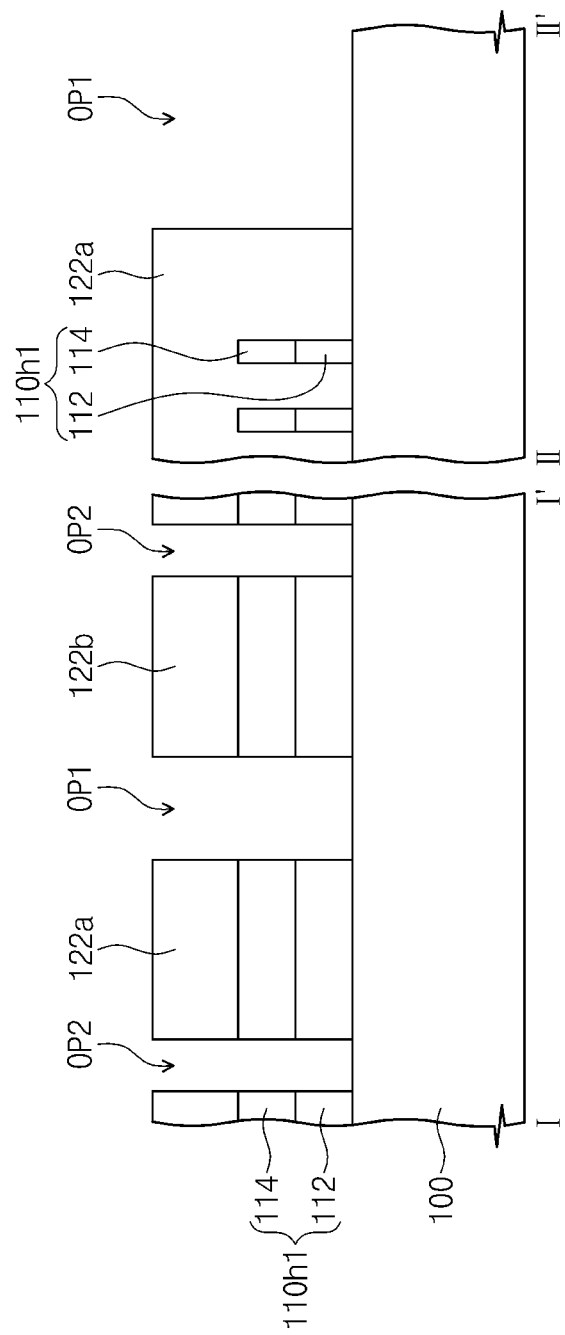
Figure 10C:
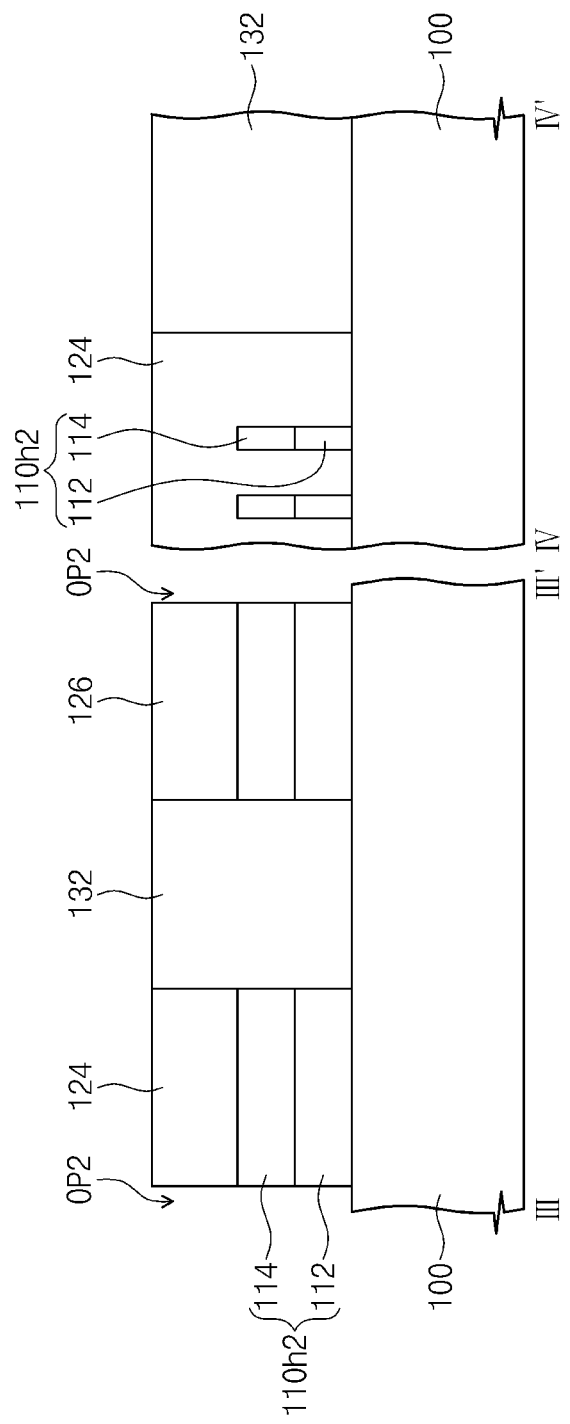

Referring to FIGS. 10A, 10B and 10C, a second etch process may be performed to remove portions of the lower separation mask patterns 122, 124 and 126 that are exposed through the openings OP1 and OP2, using the upper separation mask pattern 132 as an etch mask. The second etch process may be, for example, an anisotropic dry etch process. The second etch process may be performed until the top surface of portions of the substrate 100 overlapped by the openings OP1 and OP2 is exposed. The second etch process may also remove the first line mask patterns 110*a* and the preliminary second hardmask patterns 110*bp* that are overlapped by the first and second openings OP1 and OP2.

The second etch process may separate the first lower separation mask pattern 122 into first and second sub-separation mask patterns 122*a* and 122*b* spaced apart from each other along the first direction D1. In addition, each of the first line mask patterns 110*a* may be separated along the first direction D1 such that first hardmask patterns 110*h*1 are formed on the first and second logic cell regions CR1 and CR2. As shown in figures, the first hardmask patterns 110*h*1 may have various lengths. Furthermore, one or more of the preliminary second hardmask patterns 110*bp* may be separated along the first direction D1 such that second hardmask patterns 110*h*2 are formed to have various lengths on the third and fourth logic cell regions CR3 and CR4.

In some embodiments, as viewed in plan, the first hardmask patterns 110*h*1 of the first logic cell region CR1 may have respective end portions that are adjacent to the first cell boundary CB1 and aligned with each other along the second direction D2. Likewise, as viewed in plan, the first hardmask patterns 110*h*1 of the second logic cell region CR2 may have respective end portions that are adjacent to the first cell boundary CB1 and aligned with each other along the second direction D2. Accordingly, the same intervals may be provided between first hardmask patterns 110*h*1 that are adjacent to each other along the first direction D1 and have the first cell boundary CB1 interposed there between. As viewed in plan, the second hardmask patterns 110*h*2 of the third logic cell region CR3 may have respective end portions that are adjacent to the second cell boundary CB2, and one or more of the end portions may be offset along the first direction D1. In other words, the third logic cell region CR3 may include the second hardmask pattern 110*h*2 positioned on an outermost side and having an end portion that is relatively far away from the second cell boundary CB2, and may further include a neighboring second hardmask pattern 110*h*2 positioned along the second direction D2 and having an end portion that is relatively close to the second cell boundary CB2. Likewise, as viewed in plan, the second hardmask patterns 110*h*2 of the fourth logic cell region CR4 may have respective end portions that are adjacent to the second cell boundary CB2, and one or more of the end portions may be offset along the first direction D1. In other words, the fourth logic cell region CR4 may include the second hardmask pattern 110*h*2 positioned on an outermost side and having an end portion that is relatively far away from the second cell boundary CB2, and may further include a neighboring second hardmask pattern 110*h*2 positioned along the second direction D2 and having an end portion that is relatively close to the second cell boundary CB2. Accordingly, intervals may be provided between the second hardmask patterns 110*h*2 that are adjacent to each other along the first direction D1 and have the second cell boundary CB2 interposed there between, and such intervals may vary depending on their positions along the second direction D2.

After the second etch process, the upper separation mask pattern 132 may remain in spaces between the separation mask patterns 122*a*, 122*b*, 124 and 126. The depth of each of the openings OP1 and OP2 may be extended (e.g., along the third direction D3) and redefined to include a bottom surface corresponding to the top surface of the substrate 100.

Figure 11A:
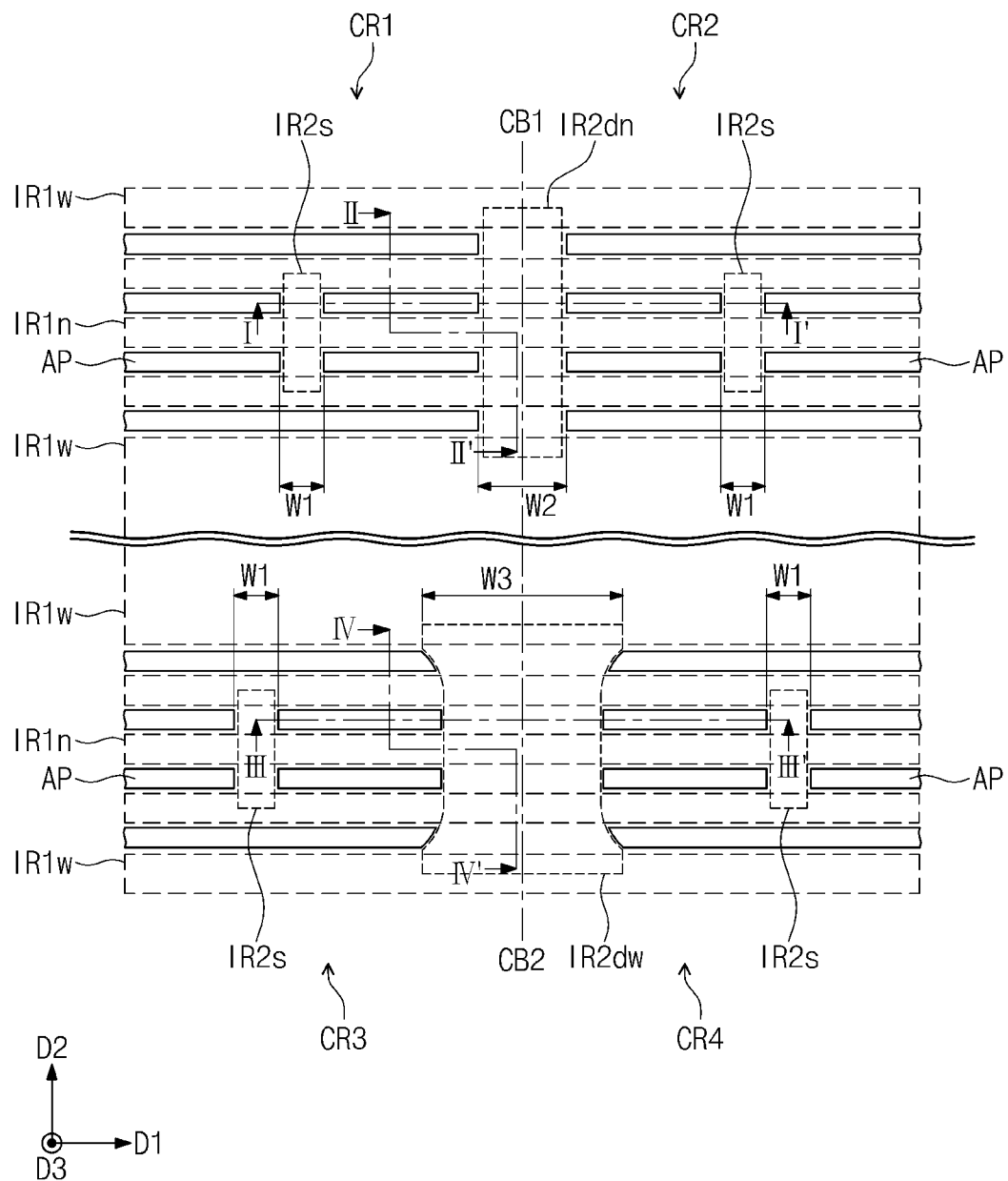
Figure 11B:
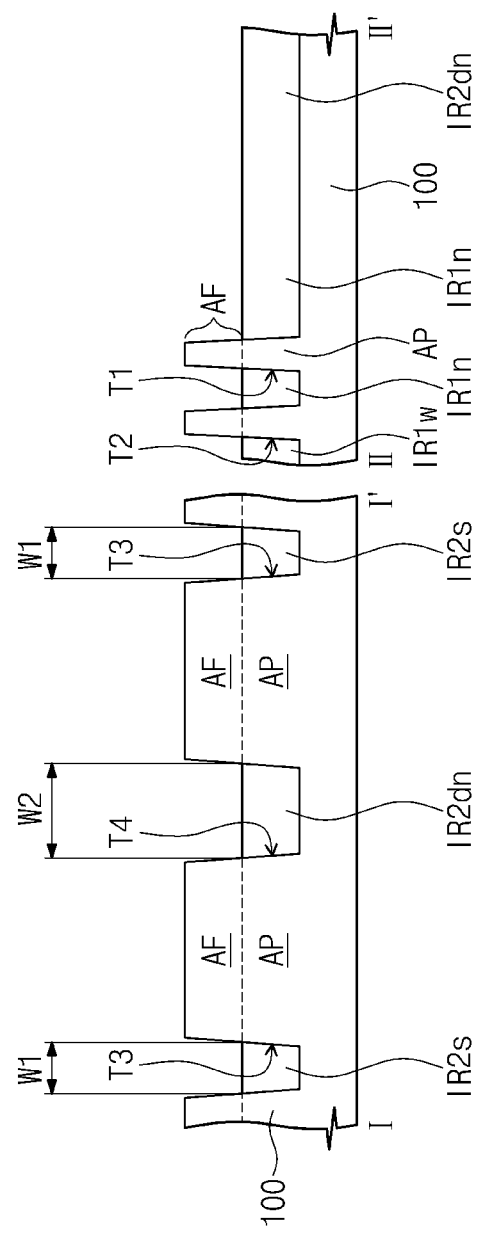
Figure 11C:
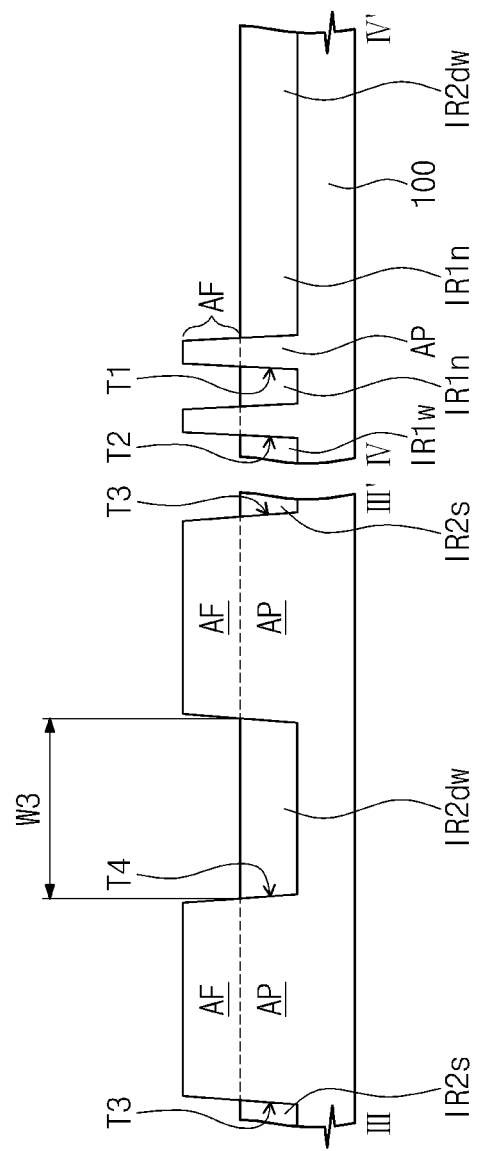

Referring to FIGS. 11A, 11B and 11C, the separation mask patterns 122*a*, 122*b*, 124 and 126 may be removed. For example, an ashing process may be performed to remove the separation mask patterns 122*a*, 122*b*, 124 and 126.

Trenches T1, T2, T3 and T4 may be formed to define active patterns AP by performing a third etch process using the first and second hardmask patterns 110*h*1 and 110*h*2 as an etch mask. The third etch process may be, for example, an anisotropic dry etch process. The trenches T1, T2, T3 and T4 may include first and second trenches T1 and T2 that define relatively long sidewalls of the active patterns AP, and third and fourth trenches T3 and T4 that define relatively short sidewalls of the active patterns AP.

As best shown in FIGS. 11B and 11C, the first trenches T1 may have substantially the same width as, or less than the width of, the second trenches T2, as measured along the second direction D2. The second trenches T2 may have various widths along the second direction D2. The third trenches T3 may have substantially the same width as, or less than the width of, the fourth trenches T4, as measured along the first direction D1. The fourth trenches T4 may have various widths along the first direction D1. For example, the fourth trench T4 between the first and second logic cell regions CR1 and CR2 may have a width that is smaller than that of the fourth trench T4 between the third and fourth logic cell regions CR3 and CR4. In some embodiments, each of the trenches T1, T2, T3 and T4 may be formed to have a width that decreases with increasing distance downward from the top surface of the substrate 100. Each of the active patterns AP may be formed to have a shape whose width decreases with decreasing distance toward the top surface of the substrate 100. Each of the widths of the trenches T1, T2, T3 and T4 discussed above may be considered as a maximum width of the trenches T1, T2, T3 and T4.

Lower portions of the trenches T1, T2, T3 and T4 may be filled to form a device isolation layer, through which upper portions of the active patterns AP are exposed. The device isolation layer may include narrow first separation regions IR1*n* in the first trenches T1, wide first separation regions IR1*w* in the second trenches T2, single diffusion break regions IR2*s* in the third trenches T3, and double diffusion break regions IR2*dn* and IR2*dw* in the fourth trenches T4. A description discussed with reference with FIGS. 2A, 2B, 3A and 3B may be identically or similarly applicable to widths of the separation regions IR1*n* and IR1*w* (i.e., first separation regions) and the diffusion break regions IR2*s*, IR2*dn* and IR2*dw* (i.e., second separation regions) and also applicable to shapes and arrangement of end portions of the active patterns AP adjacent thereto, and thus repetitive description will be omitted for brevity.

In an embodiment, the device isolation layer may be formed by a process that includes forming an insulation layer to fill the trenches T1, T2, T3 and T4 and then planarizing and etching the insulation layer to expose the upper portions of the active patterns AP. The exposed upper portions of the active patterns AP may also be hereafter defined as active fins AF. The device isolation may include at least one of, for example, a silicon oxide layer, a silicon nitride layer, a silicon oxynitride layer, a low-k dielectric layer, or the like.

As discussed above, the active patterns, according to exemplary embodiments of the present inventive concept, may be formed by a process that includes patterning line mask patterns to form the hardmask patterns which define the planar positions and shapes of the active patterns, and etching the upper portion of the substrate using the hardmask patterns as an etch mask to form trenches which define the active patterns. The patterning of the line mask patterns may include a patterning process (referred to hereinafter as a first patterning process) for removing the line mask patterns from an area where the double diffusion break region will be formed and another patterning process (referred to hereinafter as a second patterning process) for removing the line mask patterns from an area where the single diffusion break region will be formed.

The second patterning process may be performed using the upper separation mask pattern having the opening that overlaps the line mask patterns on an area where the single diffusion break region will be formed. In this case, the length of the opening may be adjusted to form the planar shapes where the opening overlaps the line mask patterns. As a result, the active patterns may be formed to have end portions that are adjacent to the single diffusion break region and are aligned with each other along a width direction of the active patterns.

The first patterning process may be performed using the lower separation mask patterns, adjacent to each other with the cell boundary interposed there between, as an etch mask. In this case, the lower separation mask patterns may be formed to have respective end portions that face each other and have rounded corners (e.g., due to characteristics of the photolithography process involved). As a result, the active patterns adjacent to the double diffusion break region may be formed to have respective end portions that are adjacent to the double diffusion break region and are offset along a length direction of the active patterns. For the reasons mentioned above, it may be difficult to subsequently form a gate pattern (i.e., the dummy gate pattern) that commonly overlaps end portions of active patterns that are adjacent to a side of the double diffusion break region. In particular, in case that the double diffusion break region is formed to have a minimum width, the foregoing problem may be more severe due to deficiency of the process margin. In a subsequent process, source/drain regions may be formed to have a shape that depends upon whether the dummy gate pattern overlaps the end portions of the active patterns adjacent to the side of the double diffusion break region. Thus if a dummy gate pattern does not commonly overlap end portions of an active pattern adjacent to the side of the double diffusion break region, a reliability of the semiconductor device may be reduced.

According to exemplary embodiments of the present inventive concept, in case that the double diffusion break region is formed to have a minimum width (i.e., in case that the narrow double diffusion break region is formed), the second patterning process may be performed such that the line mask patterns are removed from the area where the double diffusion break region will be formed. In other words, the upper separation mask pattern may have an opening that overlaps the line mask patterns formed on the area where the double diffusion break region will be formed. Therefore, the active patterns adjacent to the narrow double diffusion break region may be formed to have respective end portions aligned along a width direction of the active patterns. It may then be possible to easily form the dummy gate pattern that commonly overlaps the end portions of the active patterns adjacent to the side of the double diffusion break region. As a result, the semiconductor device may have enhanced reliability caused by improved distribution of electrical characteristics thereof.

There will hereinafter be further provided a method for manufacturing a semiconductor device including active patterns according to some exemplary embodiments of the present inventive concept.

Figure 12A:
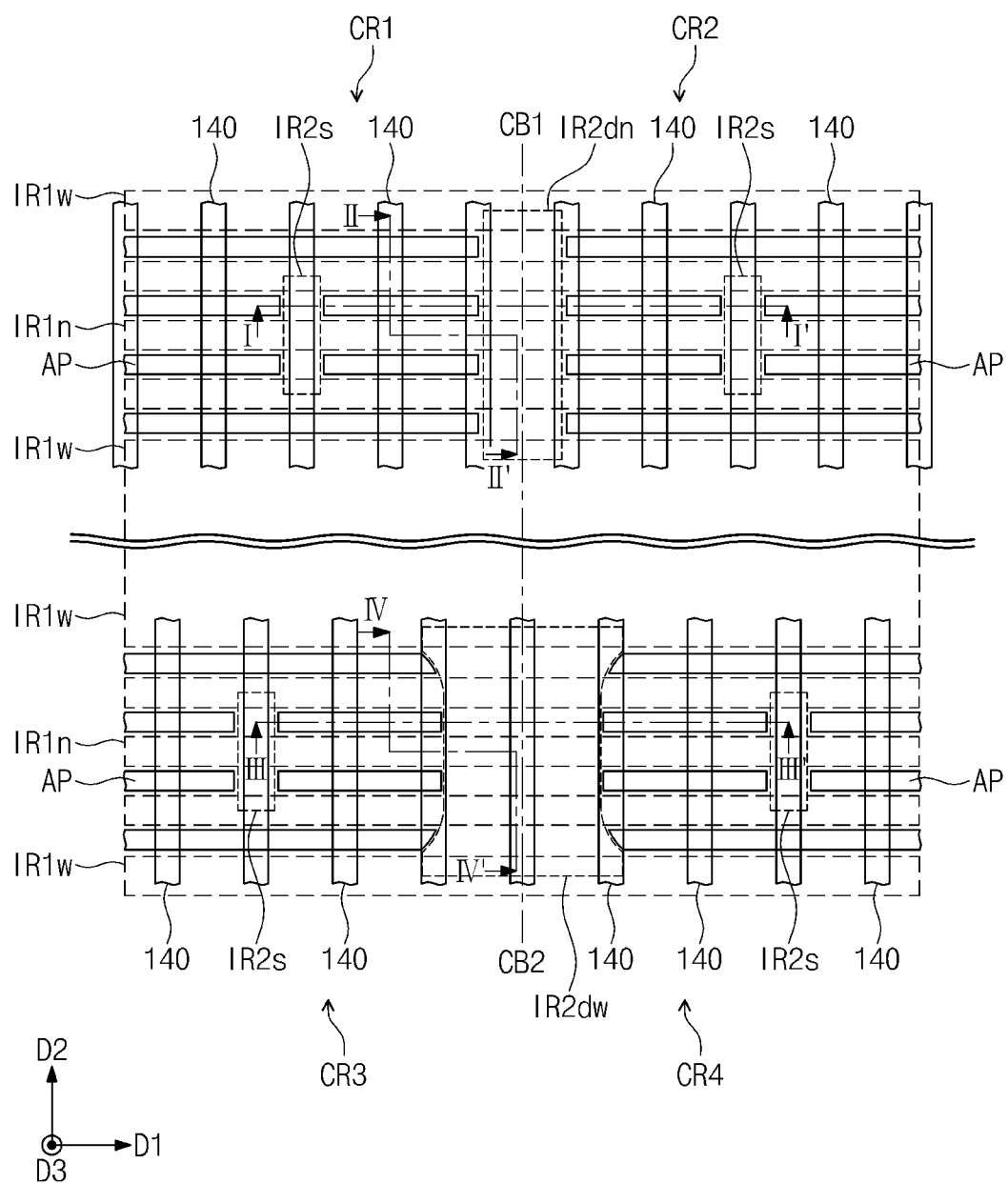
Figure 12B:
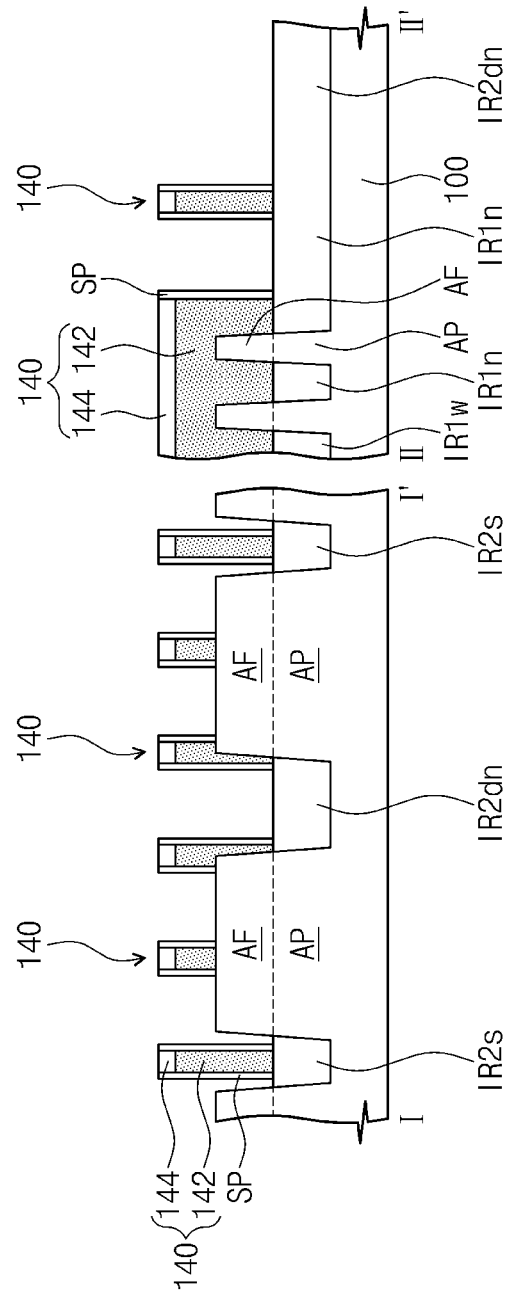
Figure 12C:
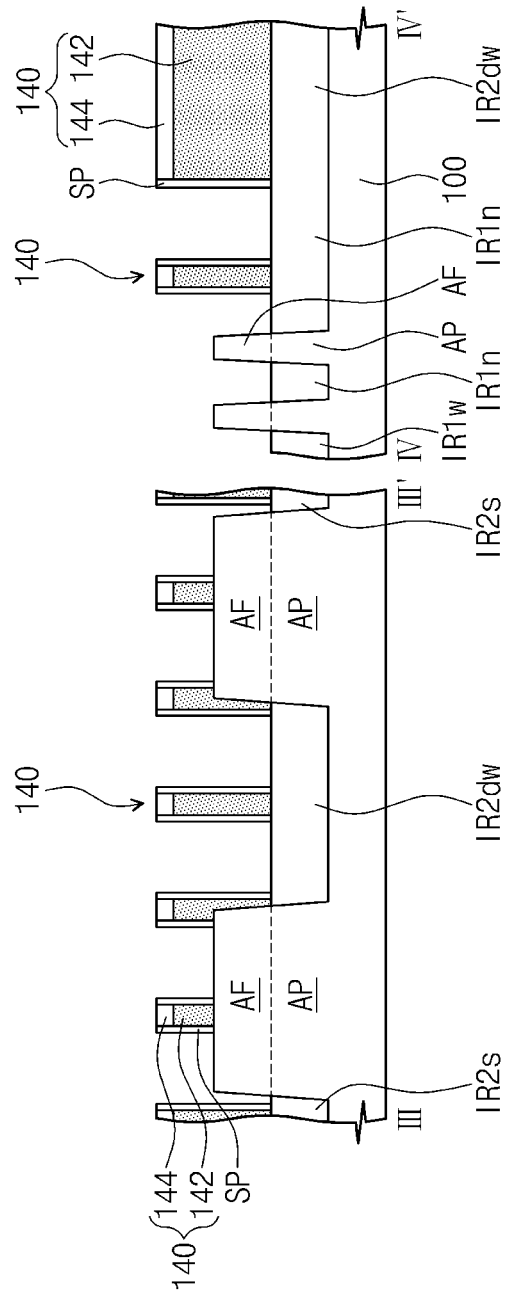

Referring to FIGS. 12A, 12B and 12C, sacrificial structures 140 may be formed to run across the active patterns AP. The sacrificial structures 140 may extend in the second direction D2 and be equally spaced apart from each other in the first direction D1. Each of the sacrificial structures 140 may include a sacrificial pattern 142 and a gate mask pattern 144 that are sequentially stacked on the substrate 100.

In some embodiments, one or more of the sacrificial structures 140 may overlap the second separation regions IR2*s*, IR2*dn* and IR2*dw*. For example, the single diffusion break region IR2*s* may be overlapped by a single sacrificial structure 140 that is spaced apart from adjacent end portions of the active patterns AP. The narrow double diffusion break region IR2*dn* may be overlapped by two sacrificial structures 140. One of the two sacrificial structures 140 may commonly overlap end portions of the active patterns AP of the first logic cell region CR1 that are adjacent to the narrow double diffusion break region IR2*dn*. Another of the two sacrificial structures 140 may commonly overlap end portions of the active patterns AP of the second logic cell region CR2 that are adjacent to the narrow double diffusion break region IR2*dn*.

The wide double diffusion break region IR2*dw* may be overlapped by three sacrificial structures 140. One of the three sacrificial structures 140 may commonly overlap end portions of the active patterns AP of the third logic cell region CR3 that are adjacent to the wide double diffusion break region IR2*dw*. Another of the three sacrificial structures 140 may commonly overlap end portions of the active patterns AP of the fourth logic cell region CR4 that are adjacent to the wide double diffusion break region IR2*dw*. Yet another of the three sacrificial structures 140 may be disposed on the narrow double diffusion break region IR2*dw* at a position overlapping the second cell boundary CB2.

The sacrificial structures 140 be formed by a process that includes forming a sacrificial layer (not shown) to cover the entire surface of the substrate 100, forming gate mask patterns 144 on the sacrificial layer, and patterning the sacrificial layer using the gate mask patterns 144 as an etch mask to thereby form the sacrificial patterns 142. The sacrificial layer may include, for example, polysilicon. The gate mask pattern 144 may include, for example, silicon nitride or silicon oxynitride.

Gate spacers SP may be formed on sidewalls of the sacrificial structures 140. The gate spacers SP may be formed by conformally forming a spacer layer to cover the sacrificial structures 140 and performing an entire anisotropic etch process on the substrate 100. The spacer layer may be formed using at least one of, for example, SiO2, SiCN, SiCON, SiN, or the like. Alternatively, the spacer layer may be formed as a multi-layer structure including at least one of, for example, SiO2, SiCN, SiCON, SiN, or the like.

Figure 13A:
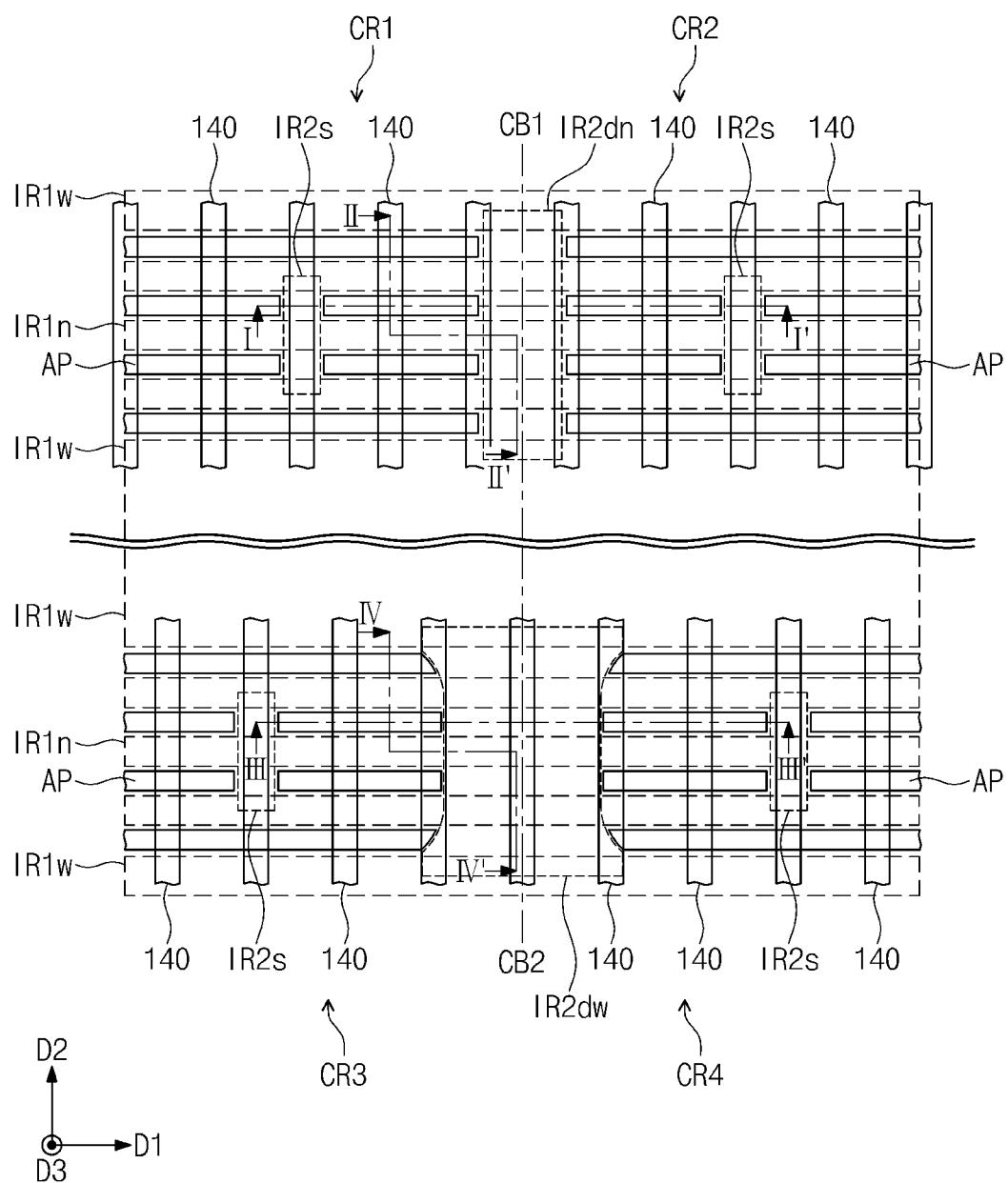
Figure 13B:
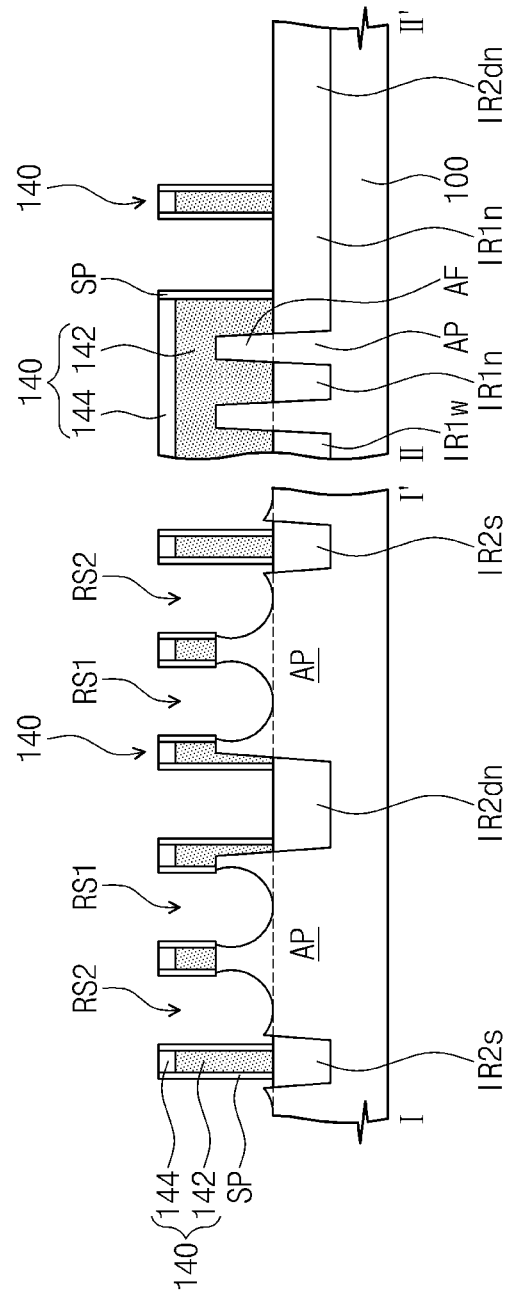
Figure 13C:
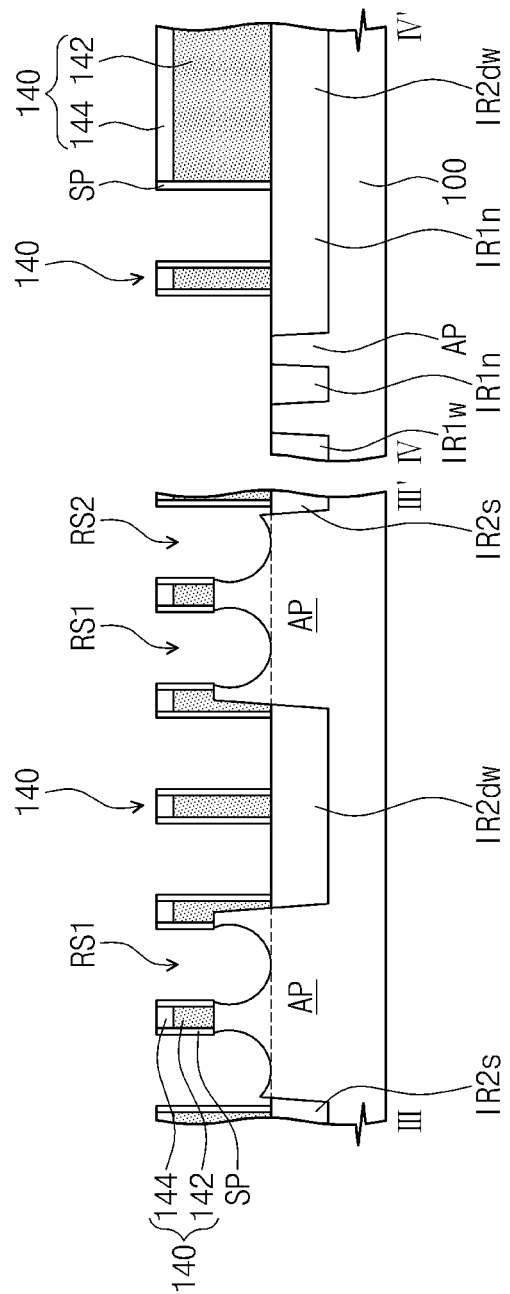

Referring to FIGS. 13A, 13B and 13C, recess regions RS1 and RS2 may be formed on opposing sides of the sacrificial structures 140. In an embodiment, the recess regions RS1 and RS2 may be formed by performing an isotropic and/or anisotropic etch process to etch the upper portions of the active fins AF using the sacrificial structures 140 an as etch mask. For example, the recess regions RS1 and RS2 may include first recess regions RS1 having a U-shaped cross-sectional shape between adjacent sacrificial structures 140, and second recess regions RS2 adjacent to the single diffusion break regions IR2*s*. During the formation of the recess regions RS1 and RS2, the active fins AF may be etched to remove the end portions thereof that are adjacent to the single diffusion break regions IR2*s*. Thus, the second recess regions RS2 may be formed not to have the U-shaped cross-sectional shape.

Figure 14A:
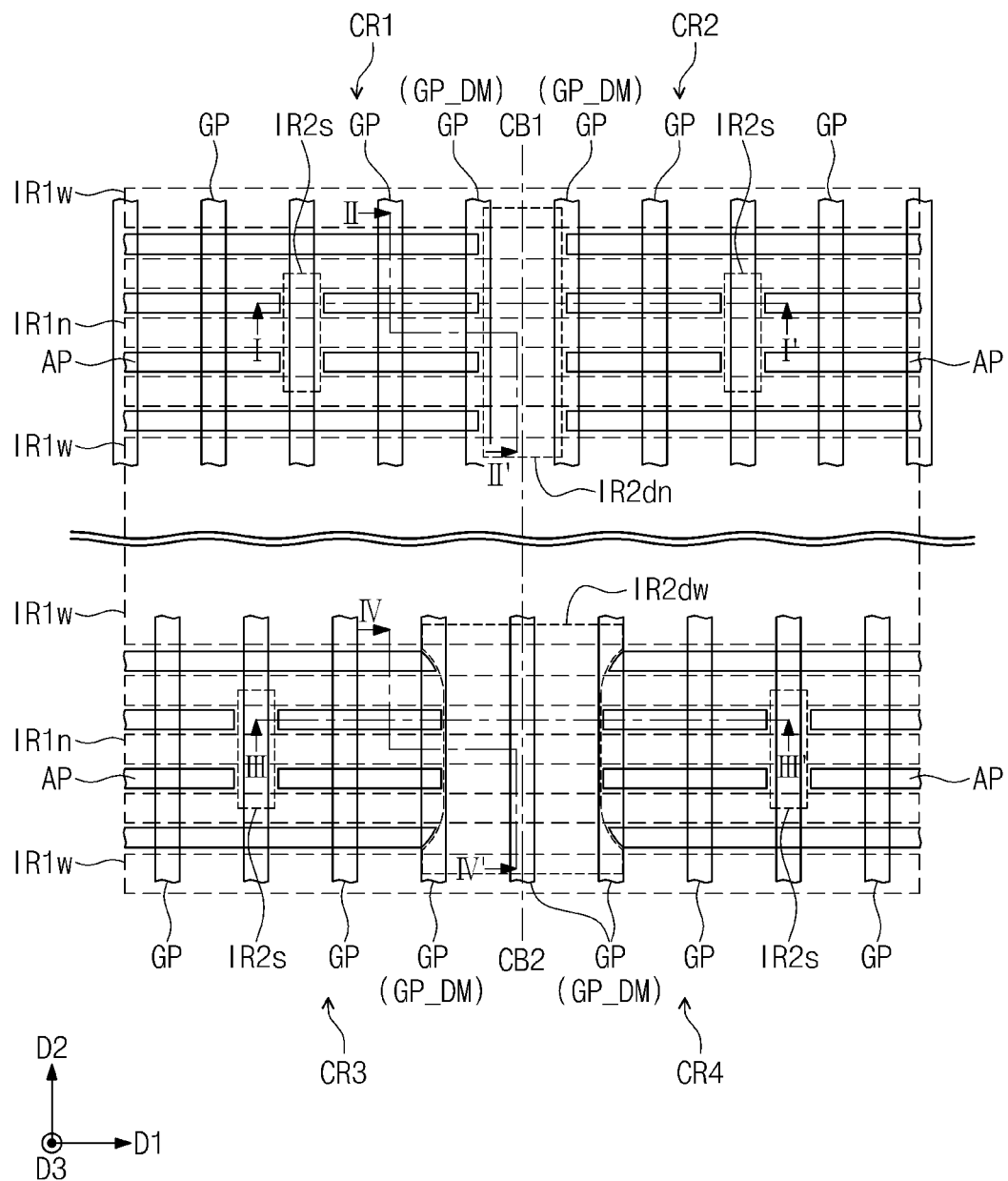
Figure 14B:
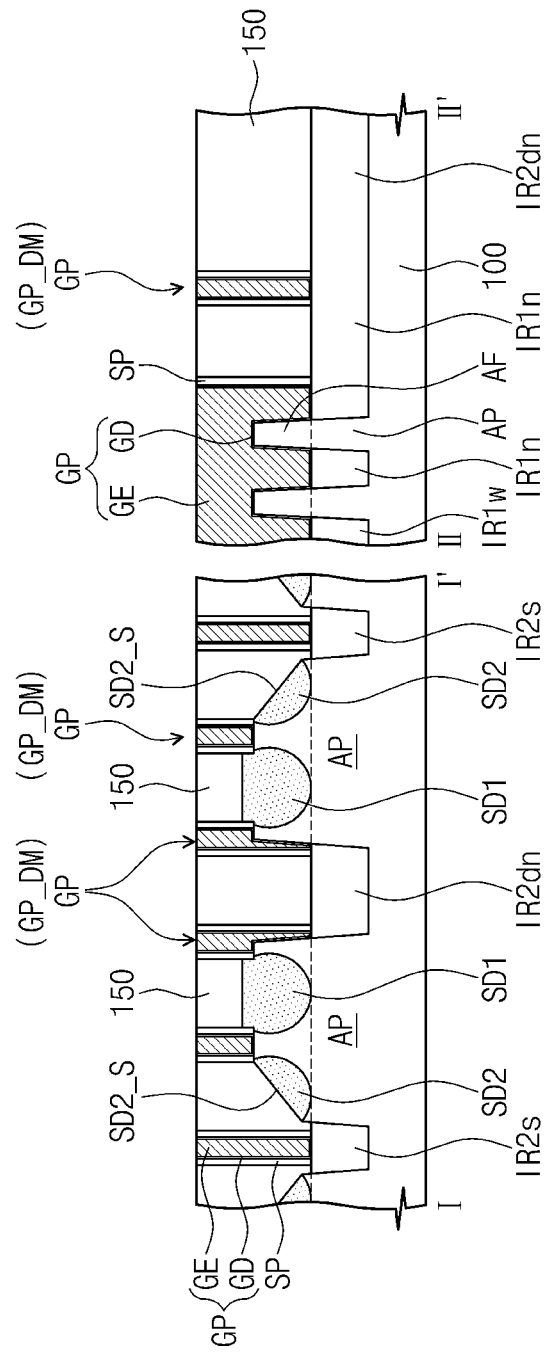
Figure 14C:
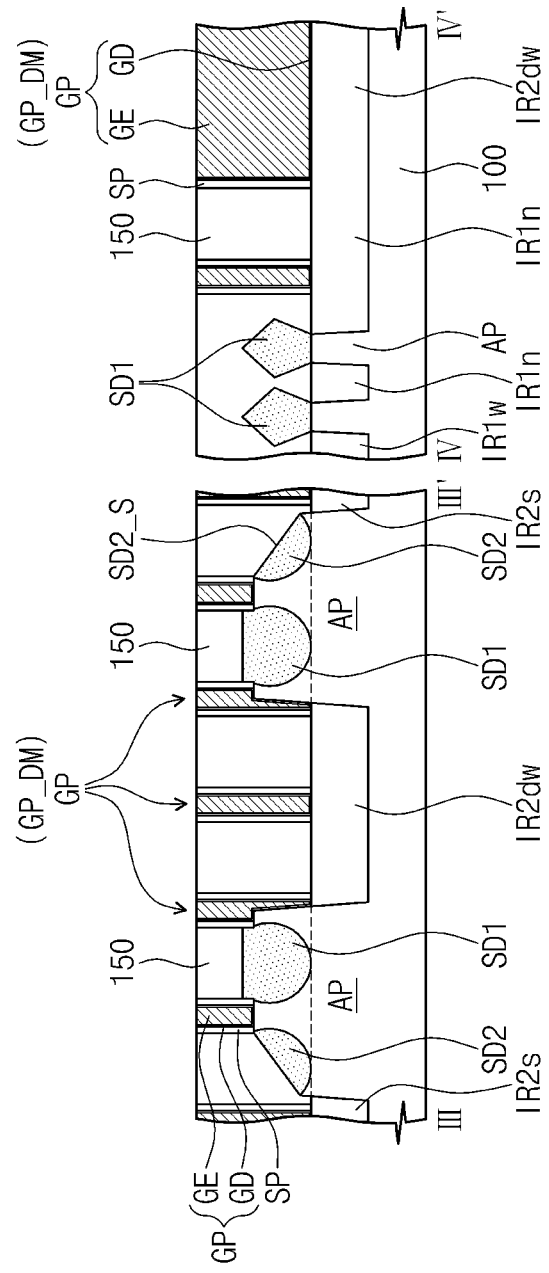

Referring to FIGS. 14A, 14B and 14C, source/drain regions SD1 and SD2 may be formed on opposing sides of the active patterns AP. In an embodiment, the source/drain regions SD1 and SD2 may be formed by performing a selective epitaxial growth process in which the active fins AF that define the recess regions RS1 and RS2, and any portion of the active patterns AP exposed through the recess regions RS1 and RS2, are used as a seed layer. That is, the source/drain regions SD1 and SD2 may include an epitaxial layer. For example, each of the source/drain regions SD1 and SD2 may include at least one material such as silicon germanium (SiGe), silicon (Si), silicon carbide (SiC), or the like, that is epitaxially grown from the active fins AF and/or the active patterns AP exposed through the recess regions RS1 and RS2. Therefore, the source/drain regions SD1 and SD2 may exert compressive strain or tensile strain (also herein generically referred to as "epitaxial strain" or "mismatch strain," as is known in the art) on portions of the active fins AF below the sacrificial structures 140 (such portions also herein referred to as channel regions). Simultaneously with, or after, the epitaxial growth process, the source/drain regions SD1 and SD2 may be doped with impurities. For example, the source/drain regions SD1 and SD2 may be doped with p-type or n-type impurities.

The source/drain regions SD1 and SD2 may include first source/drain regions SD1 located inside the first recess regions RS1 and second source/drain regions SD2 located inside the second recess regions RS2. In some embodiments, the first source/drain regions SD1 may have topmost surfaces higher than those of the active fins AF, and the second source/drain regions SD2 may have topmost surfaces lower than those of the active fins AF. Each of the second source/drain regions SD2 may have an inclined surface SD2_S that inclines downward toward the single diffusion break region IR2*s* adjacent thereto. For example, the inclined surface SD2_S may have a (111) crystalline surface.

In case that an end portion of an active pattern AP that is adjacent to the narrow double diffusion break region IR2*dn* but is not overlapped by a sacrificial structure 140, the first recess region RS1 adjacent to such an end portion (also referred to herein as a third recess region) may be formed to have the same shape as the second recess region RS2. A source/drain region (referred to hereinafter as a third source/drain region) may then be formed inside the third recess region whose shape is identical to that of the source/drain region SD2. In this embodiment, the third source/drain region may have a shape that is different from that of an adjacent source/drain region, i.e., the first source/drain region SD1, and the distribution of characteristics in the semiconductor device may be degraded as a result. For example, the electrical characteristics of the semiconductor device may be deteriorated due to reduced strain exerted on the channel region from the third source/drain region and/or contact failure between the source/drain region and source/drain contacts which are formed in a subsequent process. However, these problems can be avoided by ensuring that an end portion of an active patterns AP that is adjacent to the narrow double diffusion break region IR2*dn* is overlapped by a sacrificial structure 140 (e.g., in the manner discussed in the embodiments above) and the reliability of the semiconductor device can be enhanced.

A first interlayer dielectric layer 150 may be formed to cover the sacrificial structures 140 and the source/drain regions SD1 and SD2. For example, the first interlayer dielectric layer 150 may include a silicon oxide layer and may be formed by a flowable chemical vapor deposition (FCVD) process.

The first interlayer dielectric layer 150 may be planarized until top surfaces of the sacrificial patterns 142 are exposed. The planarization of the first interlayer dielectric layer 150 may be performed using an etch-back process or a chemical mechanical polishing process. Through the planarization process, the gate mask patterns 144 may be removed to expose the top surfaces of the sacrificial patterns 142. The planarization process may also remove upper portions of the gate spacers SP.

Once exposed, the sacrificial patterns 142 may be replaced with gate patterns GP each including a gate dielectric pattern GD and a gate electrode GE. The replacement of the sacrificial patterns 142 with the gate patterns GP may include selectively removing the sacrificial patterns 142 to form gate regions exposing the active patterns AP between the gate spacers SP and then sequentially forming a gate dielectric layer and a gate electrode layer in the gate regions. For example, the gate dielectric layer may include at least one of hafnium oxide, hafnium silicate, zirconium oxide, zirconium silicate, or the like or any combination thereof. The gate electrode layer may include a conductive metal nitride (e.g., titanium nitride, tantalum nitride, tungsten nitride, etc.), a metal (e.g., aluminum, tungsten, etc.), or the like or any combination thereof. Gate patterns GP overlapping the second separation regions IR2s, IR2dn and IR2dw may herein be referred to as dummy gate patterns GP_DM.

Optionally, the gate electrodes GE may be recessed at their upper portions and capping patterns (not shown) may be further formed on the recessed gate electrodes GE. That is, each of the gate patterns GP may include the gate dielectric pattern GD, the gate electrode GE, and the capping pattern (not shown). For example, the capping patterns (not shown) may include at least one of silicon oxide, silicon nitride, silicon oxynitride, silicon carbonitride (SiCN), silicon oxycarbonitride (SiCON), or the like or any combination thereof.

Figure 15A:
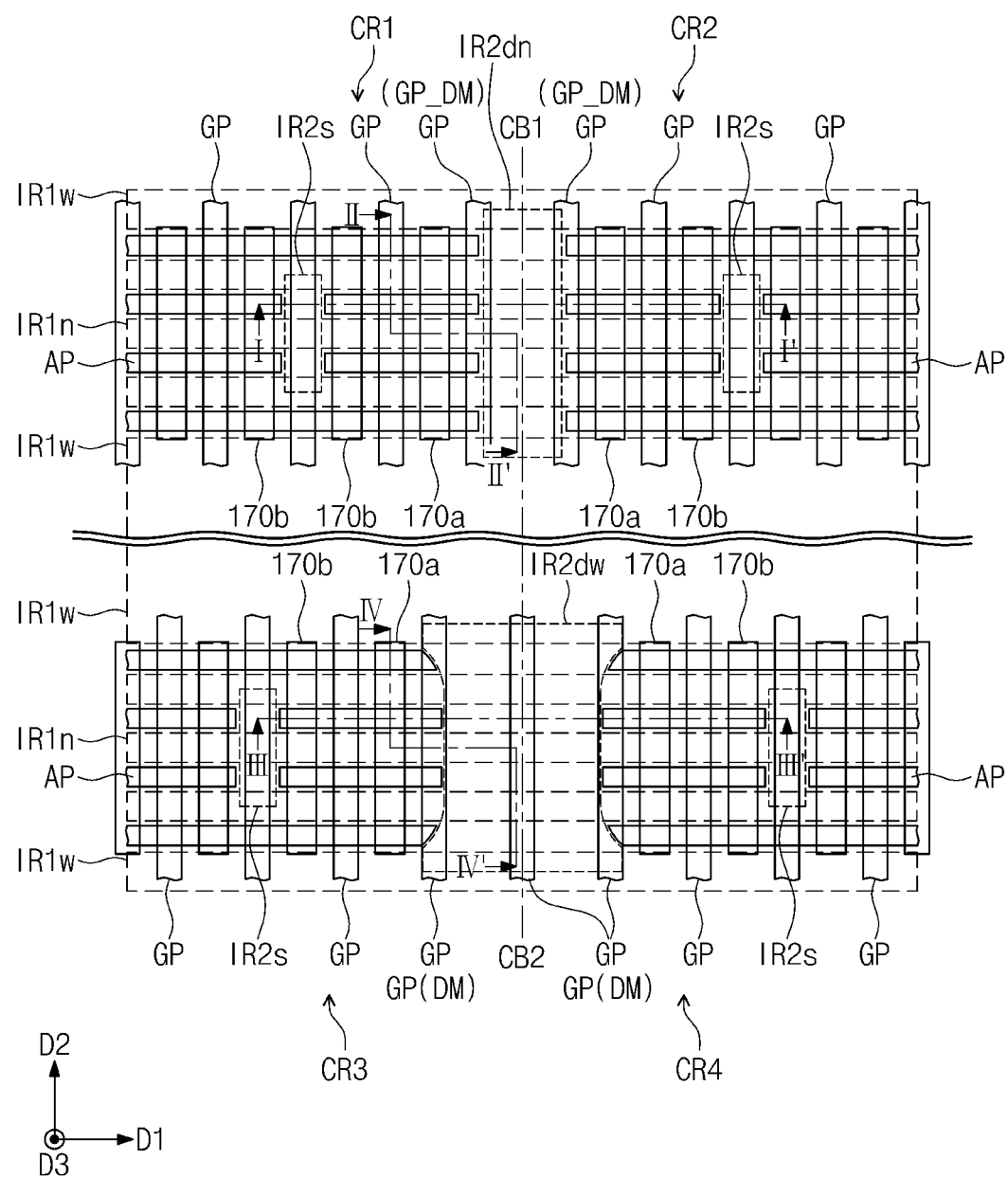
Figure 15B:
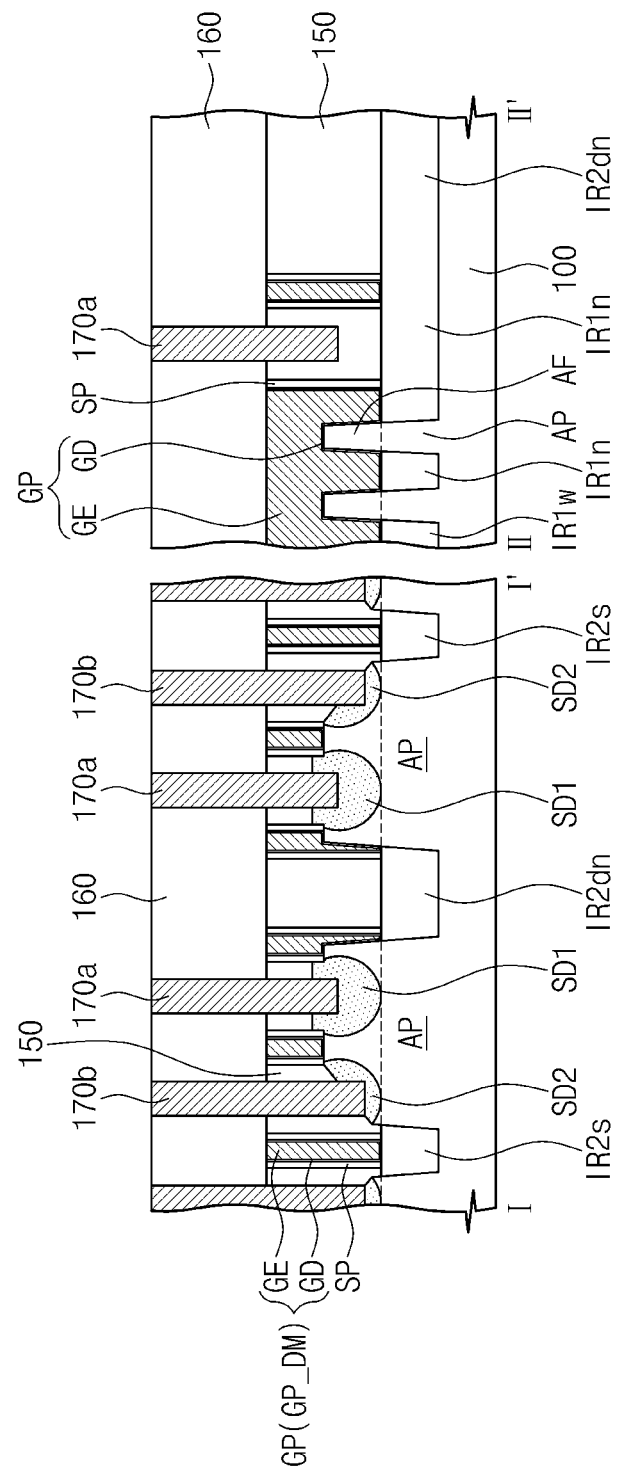
Figure 15C:
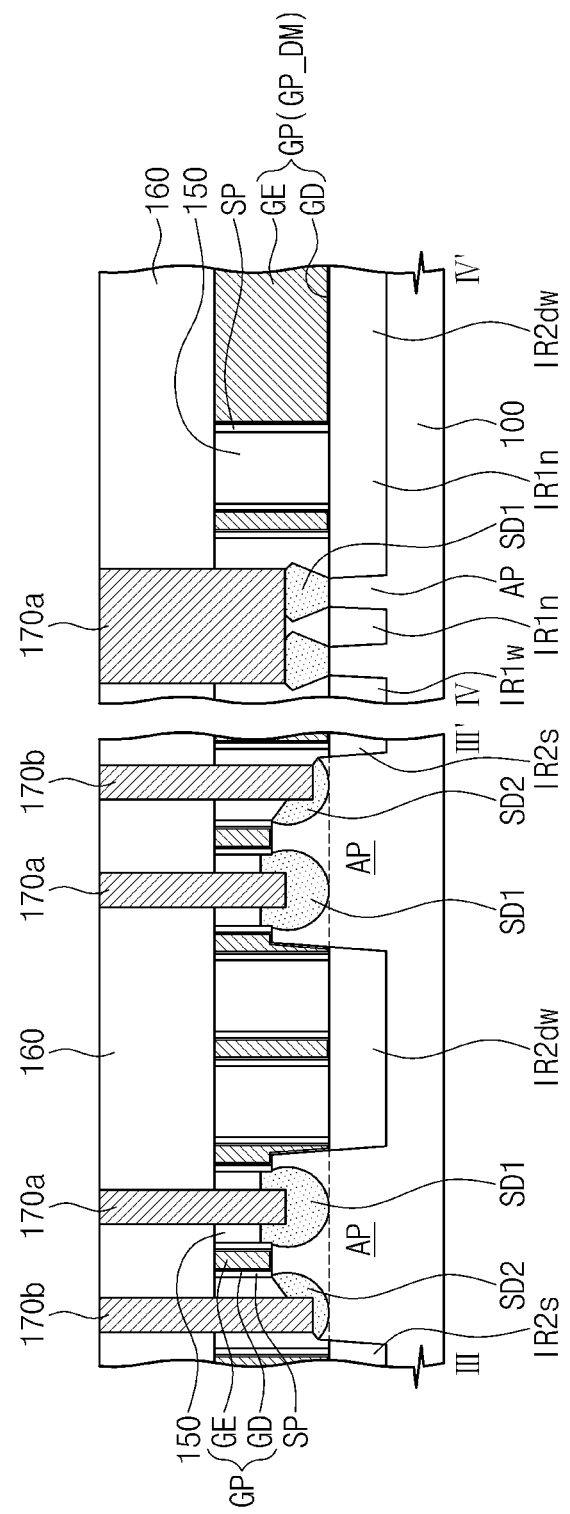

Referring to FIGS. 15A, 15B and 15C, a second interlayer dielectric layer 160 may be formed to cover the first interlayer dielectric layer 150 and the gate patterns GP. The second interlayer dielectric layer 160 may include at least one of, for example, a silicon oxide layer, a silicon nitride layer, a silicon oxynitride layer, a low-dielectric layer, or the like.

Source/drain contacts 170a and 170b may be formed to penetrate the first and second interlayer dielectric layers 150 and 160 and be connected to the source/drain regions SD1 and SD2. Each of the source/drain contacts 170a and 170b may extend in the second direction D2 to run across at least two active patterns AP. The source/drain contacts 170a and 170b may include a first source/drain contact 170a commonly connected to the plurality of the first source/drain regions SD1 disposed on a side of the gate pattern GP and a second source/drain contact 170b commonly connected to the plurality of the second source/drain regions SD2 disposed on an opposite side of the gate pattern GP. The source/drain regions commonly connected to a single source/drain contact may constitute a single multi-fin transistor. For the connection with the second source/drain regions SD2, the second source/drain contact 170b may have a bottom surface whose level is lower than that of a bottom surface of the first source/drain contact 170a. The source/drain contacts 170a and 170b may include at least one of an impurity doped polysilicon layer, a metal layer (e.g., tungsten, titanium, tantalum, etc.), a metal silicide layer (e.g., titanium silicide, tantalum silicide, tungsten silicide, etc.), or the like or any combination thereof.

Although not shown in figures, interconnect lines may be formed on the second interlayer dielectric layer 160 and electrically connected to the source/drain contacts 170a and 170b.

According to the exemplary embodiments of the present inventive concept, the active patterns may be formed to have respective end portions that are adjacent to the narrow double diffusion break region having a minimum width and are aligned in a width direction of the active patterns. The dummy gate pattern may commonly overlap the end portions of the active patterns adjacent to the narrow double diffusion break region. As a result, the substantially same shape may be implemented on the source/drain regions formed between the dummy gate pattern and its adjacent gate pattern. Therefore, distribution of electrical characteristics may be improved to enhance reliability of the semiconductor device.

Although the present disclosure has been described in connection with the embodiments illustrated in the accompanying drawings, it is not limited thereto. It will be apparent to those skilled in the art that various substitution, modifications and changes may be thereto without departing from the scope and spirit of the invention as recited in the claims.

What is claimed is:

1. A method for manufacturing a semiconductor device, the method comprising:
  forming active patterns on a substrate that includes first and second logic cell regions adjacent to each other along a first direction; and
  forming on the substrate a device isolation layer exposing upper portions of the active patterns,
  wherein forming the active patterns comprises:
    forming first line mask patterns extending parallel to each other along the first direction and running across the first and second logic cell regions;
    forming an upper separation mask pattern on the first line mask patterns, wherein the upper separation mask pattern is positioned on a first cell boundary between the first and second logic cell regions and includes a first opening overlapping at least two of the first line mask patterns;
    performing a first etch process using the upper separation mask pattern as an etch mask to form first hardmask patterns from the at least two first line mask patterns; and
    etching an upper portion of the substrate by a second etch process using the first hardmask patterns as an etch mask to form trenches defining the active patterns.

2. The method of claim 1, wherein a boundary of areas where the first opening overlaps the at least two first line mask patterns extends in a straight line over the at least two first line mask patterns.

3. The method of claim 1, further comprising, before forming the upper separation mask pattern, forming a first lower separation mask pattern covering the at least two first line mask patterns and running across the first and second logic cell regions along the first direction.

4. The method of claim 3, wherein the first opening exposes a top surface of the first lower separation mask pattern, the first opening running across the first lower separation mask pattern along a second direction crossing the first direction.

5. The method of claim 4, wherein the first lower separation mask pattern and portions of the at least two first line mask patterns overlapped by the first opening are removed by the first etch process to form the first hardmask patterns.

6. The method of claim 3, wherein the upper separation mask pattern comprises a material that is the same as that of the first lower separation mask pattern.

7. The method of claim 3, wherein the substrate further comprises third and fourth logic cell regions adjacent to each other along the first direction and separated from each other by a second cell boundary,
  wherein forming the active patterns comprises:
    forming second line mask patterns extending parallel to each other along the first direction and running across the third and fourth logic cell regions and the second cell boundary;
    forming a second lower separation mask pattern covering at least two of the second line mask patterns on the third logic cell region;
    forming a third lower separation mask pattern covering at least two of the second line mask patterns on the fourth logic cell region, wherein the second and third lower separation mask patterns are spaced apart from each other along the first direction with the second cell boundary interposed therebetween, such that a portion of at least two second line mask patterns is exposed by the second and third lower separation mask patterns; and performing a third etch process using the second and third lower separation mask patterns as an etch mask to remove the portion of the at least two second line mask patterns exposed by the second and third lower separation mask patterns, wherein the upper separation mask pattern is formed to cover the second and third lower separation mask patterns and to fill a space between the second and third lower separation mask patterns.

8. The method of claim 7, wherein the first etch process is performed to form second hardmask patterns from the at least two second line mask patterns, and wherein the second etch process uses the second hardmask patterns as an etch mask, the method further comprising, before performing the second etch process, removing the upper separation mask pattern and the first to third lower separation mask patterns remaining after the first etch process.

9. The method of claim 8, wherein the active patterns comprise:

first active patterns on the first logic cell region;
second active patterns on the second logic cell region;
third active patterns on the third logic cell region; and
fourth active patterns on the fourth logic cell region, wherein the first and second active patterns are spaced apart from each other along the first direction with the first cell boundary interposed therebetween, and the third and fourth active patterns are spaced apart from each other in the first direction with the second cell boundary interposed therebetween, wherein the trenches comprise:

first trenches defining long sidewalls of the first to fourth active patterns; and
second trenches defining short sidewalls of the first to fourth active patterns, and wherein the device isolation layer is formed by filling lower portions of the first and second trenches with an insulation layer.

10. The method of claim 9, wherein the device isolation layer comprises:

a first double diffusion break region between the first active patterns and the second active patterns; and
a second double diffusion break region between the third active patterns and the fourth active patterns, wherein the first double diffusion break region has a first width as measured along the first direction, and the second double diffusion break region has a second width as measured along the first direction that is greater than the first width.

11. The method of claim 10, wherein at least one selected from the group consisting of the first active patterns and the second active patterns comprise end portions that are adjacent to the first double diffusion break region and are aligned along a second direction crossing the first direction, and
wherein at least one selected from the group consisting of the third and the fourth active patterns comprise end portions that are adjacent to the second double diffusion break region, wherein one of the end portions is offset from another of the end portions along the first direction.

12. The method of claim 10, further comprising gate patterns that run across the active patterns, wherein two of the gate patterns overlap the first double diffusion break region and three or more of the gate patterns overlap the second double diffusion break region.

* * * * *